(12) United States Patent  (10) Patent No.: US 8,787,822 B2
Iyer et al.  (45) Date of Patent: Jul. 22, 2014

(54) ENTERTAINMENT SYSTEM

(71) Applicant: Adori Labs, Inc., Santa Clara, CA (US)

(72) Inventors: Viswanathan Iyer, Santa Clara, CA (US); Stephen Samuel, San Jose, CA (US); Kartik Parija, Bangalore (IN)

(73) Assignee: Adori Labs, Santa Clara, CA (US)

( * ) Notice: Subject to any disclaimer, the term of this patent is extended or adjusted under 35 U.S.C. 154(b) by 0 days.

(21) Appl. No.: 13/874,360

(22) Filed: Apr. 30, 2013

(65) Prior Publication Data

US 2014/0073276 A1  Mar. 13, 2014

Related U.S. Application Data

(60) Provisional application No. 61/698,266, filed on Sep. 7, 2012, provisional application No. 61/721,531, filed on Nov. 2, 2012, provisional application No. 61/760,586, filed on Feb. 4, 2013.

(51) Int. Cl.
*H04H 40/00* (2008.01)
*H04H 60/27* (2008.01)
*H04H 60/21* (2008.01)

(52) U.S. Cl.
CPC ..................................... *H04H 60/27* (2013.01)
USPC .......................................... 455/3.06; 455/313

(58) Field of Classification Search
CPC ............................... H04H 60/27; H04H 60/37
USPC .................................................. 455/3.06, 313
See application file for complete search history.

(56) References Cited

U.S. PATENT DOCUMENTS 5,862,189 A * 1/1999 Huisken et al. ............... 375/341
7,881,365 B2 * 2/2011 Lai et al. ....................... 375/232
2006/0047722 A1 * 3/2006 Walker et al. ................. 707/204

OTHER PUBLICATIONS

Co-pending U.S. Appl. No. 13/874,374 by Iyer filed Apr. 30, 2013.
Co-pending U.S. Appl. No. 13/895,257 by Iyer, V. et al., filed May 15, 2013.

* cited by examiner

*Primary Examiner* — Lee Nguyen

(57) ABSTRACT

Disclosed here is an audio system and a method of operating the same. The audio system comprises a receiver module for receiving radio frequency (RF) input signal associated with a plurality of radio stations, an Analog to Digital Converter (ADC) coupled to the receiver for digitizing the received RF input signal and a stored set of computer-executable instructions. The instructions include those for selecting a particular radio station from the plurality of radio stations, shifting the frequency of the particular radio station to an intermediate frequency (IF), demodulating the frequency shifted portion of the RF input signal to retrieve an output signal and generating a time division multiplexed signal based on the output signal.

27 Claims, 23 Drawing Sheets

| STATION | | REACH | | | | AD EFFECTIVENESS | | |
|---|---|---|---|---|---|---|---|---|
| | | 18-25yr | 25-35yr | 35-50yr | 50yr and above | Total Ad Cost ($) | Cost Per Reach (cents) | Cost Per 18-25yr Reach (cents) |
| FM 95.5 | Ad #A | 5000 | 1200 | 100 | 10 | 150 | 2.38 | 3.00 |
| | Ad #B | 6000 | 3000 | 500 | 50 | 100 | 1.05 | 1.67 |
| | Ad #C | 8000 | 4000 | 120 | 40 | 120 | 0.99 | 1.50 |
| | Ad #D | 4000 | 3000 | 100 | 30 | 140 | 1.96 | 3.50 |
| | Ad #E | 3500 | 1200 | 120 | 90 | 180 | 3.67 | 5.14 |
| FM 98.5 | Ad #A | 500 | 800 | 900 | 400 | 125 | 4.81 | 25.00 |
| | Ad #B | 800 | 900 | 830 | 430 | 100 | 3.38 | 12.50 |
| | Ad #C | 900 | 830 | 1000 | 700 | 150 | 4.37 | 16.67 |
| | Ad #D | 800 | 700 | 1200 | 800 | 180 | 5.14 | 22.50 |
| | Ad #E | 780 | 760 | 823 | 600 | 125 | 4.22 | 16.03 |
| FM 99.5 | Ad #A | 1500 | 3000 | 1500 | 1000 | 200 | 2.86 | 13.33 |
| | Ad #B | 1400 | 2000 | 1200 | 1200 | 250 | 4.31 | 17.86 |
| | Ad #C | 1900 | 5000 | 1400 | 3000 | 300 | 2.65 | 15.79 |
| | Ad #D | 1800 | 3000 | 1600 | 3500 | 350 | 3.54 | 19.44 |
| | Ad #E | 1700 | 4000 | 1200 | 4000 | 400 | 3.67 | 23.53 |

FIG. 7c

| TOP SONGS/PROGRAMS RECORDED | TOTAL UNIQUE RECORDINGS |
|---|---|
| SONG #A | 8000 |
| PRG #A | 6000 |
| SONG #B | 4000 |
| SONG #C | 3500 |
| PRG #B | 3200 |

*FIG. 8c*

| TOP SONGS REPLAYED | TOTAL REPLAYS | TOTAL UNIQUE REPLAYS |
|---|---|---|
| SONG #A | 15000 | 5400 |
| SONG #B | 12000 | 4300 |
| SONG #C | 11500 | 2500 |
| SONG #D | 10000 | 1500 |
| SONG #E | 8000 | 1250 |

FIG. 8d

| TOP STATIONS ON FAVORITE LIST | TOTAL # |
|---|---|
| FM 88.4 | 15000 |
| FM 88.9 | 13000 |
| AM 450 | 10000 |
| FM 99.5 | 8000 |
| FM 106.5 | 7500 |

FIG. 8e

| TOP SEARCH TERMS | TOTAL # |
|---|---|
| CONCERT GAGA WIN | 15500 |
| NPR BBC NEWS | 8000 |
| SOFT-POP | 5400 |
| EMINEM | 3400 |
| APPLE | 1200 |

*FIG. 8f*

ENTERTAINMENT SYSTEM

CLAIM OF PRIORITY

This application claims the benefit of U.S. Provisional Application Ser. No. 61/698,266, filed Sep. 7, 2012; U.S. Provisional Application Ser. No. 61/721,531, filed Nov. 2, 2012; and U.S. Provisional Application Ser. No. 61/760,586, filed Feb. 4, 2013, all of which are incorporated herein by reference for all purposes in its entirety.

FIELD

The present invention generally relates to an entertainment system.

BACKGROUND

Consumers are spending a significant amount of time listening to AM/FM radio stations during the course of the day, including when traveling in the automobiles. Consumers are also demanding entertainment from various other sources such as satellite radio, internet streaming radio, MP3 players, CD Player, etc. Content, whether in live broadcast, satellite, or other internet-based streaming, must be served to the consumer seamlessly and be made available on demand. This requires a dramatic increase in feeds in number of tuners and demodulators to provide all these services.

Traditional analog tuner architectures do not effectively scale to support receiving multiple radio stations simultaneously. For example, to support the simultaneous access to two radio stations, a system must include two analog tuners and four demodulators. Since analog tuners consume the largest amount power in the RF front end, the overall system power increases and the footprint for four RF tuners account for considerable board size and increased costs. Further, changes in the modulation format such as the relatively recent inclusion of HD radio in the FM band forces customers to replace the radios to receive the content in the new spectrum.

Further, AM/FM radio stations have great difficulty in accurately measuring the reach (e.g., the number of audience) who are listening to their audio programs. Traditionally, AM/FM radio stations have relied on surveys of a sample population of radio listeners, conducted by third parties such as Nielsen Media, to determine the possible reach of their audio programs. However, such surveys can be misleading due to how the sample population of radio listeners were chosen for the survey, how the sampled population understands terms such as "listening" when responding to queries of the survey, etc.

Among teaching a variety of other things, certain aspects of the inventions herein have embodiments which may satisfy one or more of the above-described issues.

SUMMARY

Introduced here are methods, systems, paradigms and structures for providing an entertainment system. In one embodiment, an audio system comprises a receiver module for receiving a radio frequency (RF) input signal of a given bandwidth, where the received RF input signal is associated with a plurality of radio stations. Each radio station is associated with a given frequency within the given bandwidth of the received RF input signal. The audio system further comprises an Analog to Digital Converter (ADC) coupled to the receiver, where the ADC is configured to digitize the received RF input signal. The audio system further comprises a processor that is coupled to the ADC.

The audio system further comprises at least one memory storing computer-executable instructions, where the processing module is configured to access the at least one memory and execute the computer-executable instructions to perform a set of acts. The acts include selecting a particular radio station from the plurality of radio stations, where the selection is performed by selecting a portion of the digitized RF input signal associated with a particular frequency, further where the particular frequency is associated with the particular radio station. The acts further include shifting the particular frequency associated with the selected portion of the digitized RF input signal to an intermediate frequency (IF). The acts further include demodulating the frequency shifted portion of the RF input signal associated with the particular radio station, the demodulation resulting in an output signal. The acts further include generating at least one time division multiplexed signal based on the output signal.

Some embodiments of the invention have other aspects, elements, features, and steps in addition to or in place of what is described above. These potential additions and replacements are described throughout the rest of the specification.

BRIEF DESCRIPTION OF THE DRAWINGS

These and other objects, features and characteristics of the present invention will become more apparent to those skilled in the art from a study of the following detailed description in conjunction with the appended claims and drawings, all of which form a part of this specification. In the drawings:

FIG. 7C provides an illustrative example of an ad campaign effectiveness report that can be used by marketing agencies to determine the cost and effective reach achieved by their ad campaign, carried out over multiple broadcast stations;

FIG. 8C provides an illustrative example of a table of top songs and programs recorded within a given time period by the users using the audio streaming device and the total number of unique recordings of each of the songs/programs recorded;

FIG. 8D provides an illustrative example of a table of top songs replayed within a given time period by the users using the audio streaming device the total replays of the top songs and the total number of unique replays of each of the top songs;

FIG. 8E provides an illustrative example of a table of top broadcast stations on the favorite list of the users using the audio streaming device and the total number of listeners for each broadcast station;

FIG. 8F provides an illustrative example of a table of top search terms by users of the audio streaming device and the number of searches garnered by each term;

DETAILED DESCRIPTION

Hereinafter, descriptions will be provided on embodiments of the present invention with reference to the drawings.

References in this description to "an embodiment", "one embodiment", or the like, mean that the particular feature, function, or characteristic being described is included in at least one embodiment of the present invention. Occurrences of such phrases in this specification do not necessarily all refer to the same embodiment, nor are they necessarily mutually exclusive.

Various examples of the techniques introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the techniques can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this section.

Figure 1:
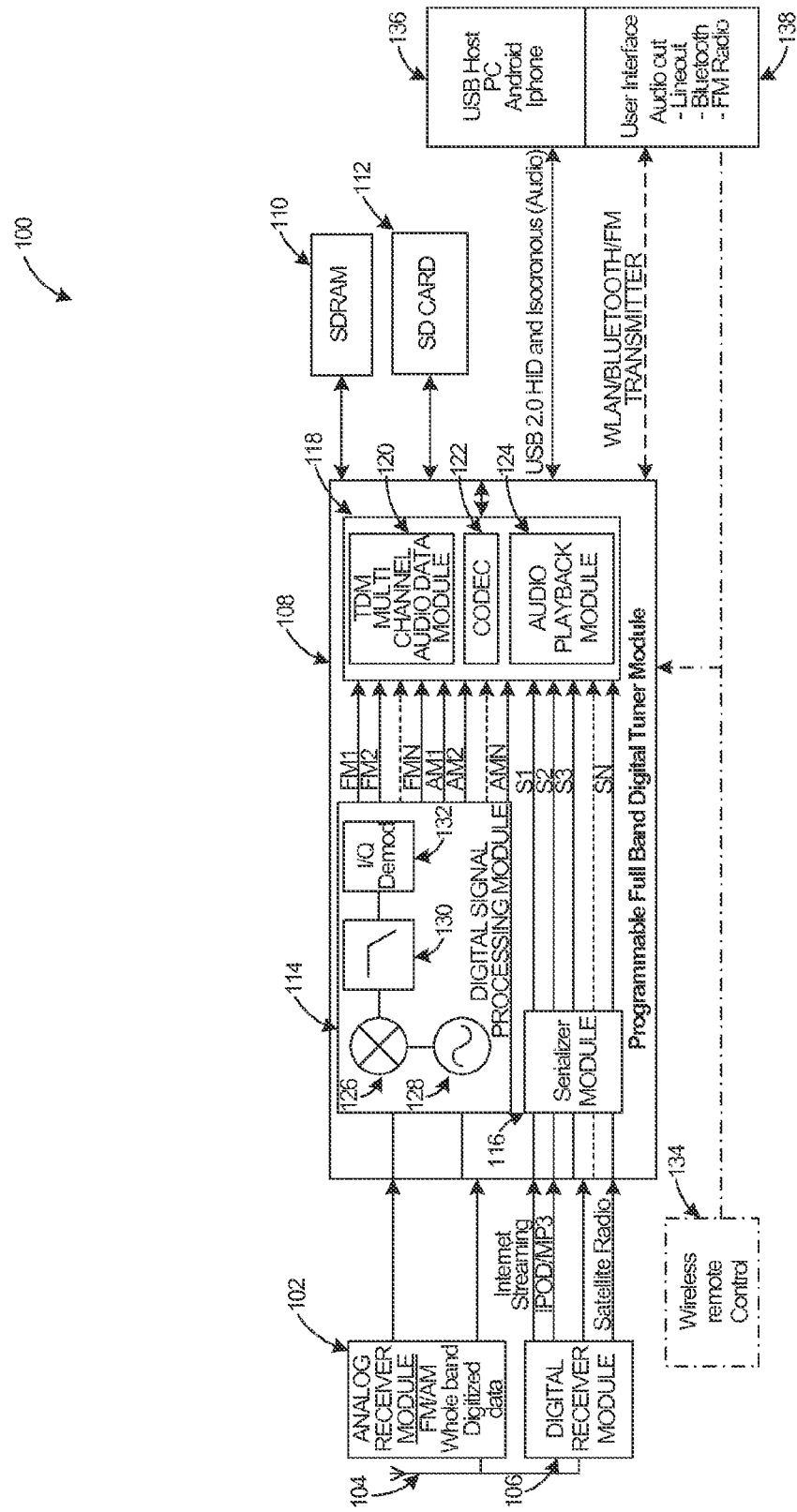
FIG. 1 provides an embodiment of an audio streaming device.

FIG. 1 and the following discussion provide a description of an embodiment of an audio streaming device 100 that can be utilized to record and playback audio from various sources, including audio programming broadcast over the various radio bands, such as FM, AM, satellite, etc. In embodiments, the audio streaming device 100 captures and records programming broadcast over a full radio band (e.g., the full FM radio band ranging from 87.5 MHz to 108.0 MHz), allowing a user to choose and playback any of the recorded programming at a later time (measured from the time of broadcast of the programming).

In embodiments, the audio streaming device 100 splits the radio signal captured across a full band into one or more constituent broadcast channels, where each broadcast channel is associated with a particular audio programming. The audio streaming device 100 demodulates (i.e. extracts the original audio programming-bearing signal from a carrier wave that is embedded with the audio programming-bearing signal) the radio signal associated with each broadcast channel (when required) and records the audio programming associated with each constituent broadcast channel as individual audio programs that a user can specifically request and playback at a later time.

As shown in FIG. 1, the audio streaming device 100 includes an analog receiver module 102 and a digital receiver module 106, where both the analog 102 and digital 106 receiver modules utilize an antenna 104 to receive the broadcast signals that include original information-bearing signals (embedded in a analog carrier wave) as analog and digital signals respectively. In embodiments, the receiver modules 102, 106 include one or more band pass filters (not shown) to select a certain frequency range of radio frequency (RF) signals (e.g., FM range signals, AM range signals, DAB range signals, etc.), which are further processed for audio programming signals, and reject the remaining radio signals that fall outside the frequency range. For example, at least one of the band pass filter in analog receiver module 102 can be set to select the FM frequency range of 87.5 MHz to 108.0 MHz and reject the RF signals that fall outside the FM frequency range.

In embodiments, the receiver modules 102, 106 further include an Analog to Digital Converter (ADC) (not shown) to convert the selected analog RF signals into digital format, which can then be digitally processed to select and extract (i.e. demodulate) the various embedded audio programming associated with various broadcast channels. In embodiments, the ADC converts the full band of RF analog signal into full band of RF analog signal in digital format. It should to be understood that the receiver modules 102, 106 of the audio streaming device 100 can be modified to receive any data (including audio information) bearing RF signals for digitization and further digital processing of the digitized data to extract the embedded (i.e. modulated) data. In this disclosure, the various discussions pertaining to processing of RF signals associated with the FM band is used mainly for illustration purposes and should not be considered as limiting the scope of the disclosed audio streaming device 100. Additional details of the receiver module are discussed in detail with reference to FIG. 2.

In embodiments, the digital receiver module 106 receives audio programming in digital format (e.g., MP3) from various input sources, such as personal music players (e.g., IPOD), streaming internet radios, etc. In embodiments, the digital receiver module 106 receives analog signals of a satellite radio with embedded (i.e. modulated) audio programming data as digital signals. As discussed above, the digital receiver module 106 utilizes an ADC to convert the analog satellite radio signals into digital format, which can then be demodulated to gather embedded audio programming data as digital signals.

In embodiments, the audio streaming device 100 includes a full band Programmable Digital Tuner (PDT) module 108 for receiving the digitized data of the RF full band from the analog and digital receiver modules 102, 106 and recording after demodulating (when necessary) the audio programming modulated within the received RF full band data. In embodiments, the PDT 108 and its various functions can be implemented by a field programmable gate array (FPGA), an application specific integrated circuit (ASIC) and/or any commercially available digital signal processor.

In embodiments, the PDT 108 includes a digital signal processing (DSP) module 114, which supports near simultaneous multiple channel demodulation operation. The DSP module 114 receives the digitized data from the analog receiver module 102 and demodulates the audio programming embedded in the digitized RF carrier signal. In embodiments, the DSP 114 includes a Direct Digital frequency Synthesizer (DDS) 128 (also referred to as the Numerically Controlled Oscillator (NCO)) and a digital mixer 126, both implemented using digital circuitry, to down convert the frequency of the digitized RF signal to a lower intermediate frequency (IF) before further processing of the digitized RF signal.

In embodiments, the DSP 114 includes a decimating low pass digital filter 130 (e.g., a finite impulse response filter (FIR)), implemented as a set of executable instructions, to receive the down-converted digitized RF signal and select/filter a portion of digitized RF signal associated with a given broadcast channel (e.g., broadcast channel of a particular radio station). It should be noted that the decimating low pass digital filter 130 is provided as a non-limiting example. Any well-known digital filter that can perform the function of the decimating low pass digital filter 130 can be utilized to select/filter the portion of digitized RF signal associated with the given broadcast channel.

In embodiments, the DSP 114 includes a digital demodulator 132 to demodulate (i.e. extract) the audio programming and any digital data (transmitted along with the audio programming) from the filtered portion of digitized RF signal associated with the given broadcast channel. Utilizing Radio Data System (RDS), a communication protocol, small amounts of digital data, such as name of broadcast station, date, time, song title, etc., can be embedded in conventional FM radio broadcasts.

In embodiments, the digital demodulator 132 is configured to demodulate digital data modulated using custom algorithms. The custom algorithms can be implemented either as hardware, software or a combination of both. The audio streaming device 100 is configured to demodulate portions of the RDS digital data modulated using the custom algorithm while other devices without the such configuration are unable to demodulate the digital data. In embodiments, such configuration includes implementing demodulation algorithms based on the custom modulation algorithms that were used to modulate the digital data for RDS.

It is envisioned that the broadcast station sending the digital data using RDS, along with their audio programming, will modulate portions of their digital data using the custom algorithms, allowing only the audio streaming device 100 to demodulate such portions of their digital data. Such custom digital data can include quick response code (QR code), digital coupons, web links, twitter messages, etc., where the DSP 114 can demodulate and share the custom digital data with the user. In embodiments, the custom digital data can be displayed to the user through a display device associated with the audio streaming device 100. The user can retrieve the received custom digital data and perform various functions associated with the custom digital data, enabling the user and the broadcast station to interact.

For example, a user can scan a displayed QR code from a broadcast station, using a smartphone, to open a webpage to enter into a content promoted by the broadcast station. Such an interaction allows the listener of the broadcast station to not only interact with the broadcast station but also enables the broadcast station to potentially measure the reach of the broadcast station's audio programs. Other applications based on such custom digital data that enable broadcast stations and users to interact can be implemented using the above disclosed system. The example provided here is for illustrative purposes and is not intended to limit the scope of the envisioned system that enables broadcast stations and users to interact.

In embodiments, the digital demodulator 132 of the DSP 114 is implemented as various algorithms (i.e. as a set of executable instructions), such as envelope detector algorithm, phase discriminator algorithm, frequency discriminator algorithm, etc., where a particular algorithm is utilized to perform demodulation of a particular RF signal based on the modulation of the particular RF signal. For example, the envelope detector algorithm can be utilized to demodulate amplitude modulated (AM) RF signals, while frequency discriminator algorithm can be utilized to demodulate frequency modulated (FM) RF signals.

In embodiments, the DSP 114 includes a plurality of sets of DDS 128, mixer 126, filter 130 and demodulator 132, each demodulating audio programming associated with a particular broadcast channel present within the digitized RF signal. In another embodiment, the DSP 114 includes a single set of the DDS 128, mixer 126, filter 130 and demodulator 132, operating at a faster data rate than the frequency of the demodulated RF signal and demodulating audio programming associated with each of the broadcast channels present within the digitized RF signal. The DSP 114 provides the demodulated audio programming as multiple parallel streams of data.

In embodiments, the DSP 114 provides any demodulated digital data (such as broadcast station name, etc.), along with its associated audio programming, as a sub-stream of data (not shown), which can be stored and utilized to provide additional information regarding the associated audio programming. For example, the DSP 114 demodulates the audio programming associated with the various FM broadcast channels (in frequency range of 87.5 MHz to 108.0 MHz) along with the RDS data embedded in each of FM broadcast channels and the various AM broadcast channels (in frequency range 535 KHz to 1605 KHz) and provides the audio programming and any associated RDS data as near simultaneous audio data streams that can be played immediately or stored and played back at a later time.

In embodiments, the serializer module 116 receives streaming audio programming over an Internet-Protocol (IP) based network as data packets. The serializer module 116 gathers the streaming audio programming over the various data packets and creates an audio programming stream. In embodiments, the serializer module 116, similar to the DSP 114, includes one or more sets of DDS 128, mixer 126, filter 130 and demodulator 132, for demodulating audio programming (present as digital signal) of each satellite channel present within the digitized RF signal and providing the demodulated audio programming as data streams. In embodiments, the serializer module 116 includes data channels to interface with various portable music players (e.g., an Apple IPOD, etc.) and other electronic devices and receive audio programming that could be played or stored and played back at a later time.

In embodiments, the audio streaming device 100 includes a Data Management Module (DMM) 118 to receive and manage the demodulated audio programming (as data streams) from the various sources. The DMM 118 includes a Time Division Multiplexing (TDM) data module 120 and a Audio codec module 122 to compress and store the various received audio programming data streams in local buffers 110 (e.g., SDRAM), where the various audio compression and decompression algorithms to compress/decompress the audio programming data streams are performed by the Audio codec module 122. In embodiments, the data streams are compressed using well-known lossy audio compression algorithms, such as MP3, and lossless compression algorithms, such as Free Lossless Audio Codec (FLAG), Apple's Apple Lossless (ALAC), MPEG-4 ALS, Microsoft's Windows Media Audio 9 Lossless (WMA Lossless), Monkey's Audio, TTA, WavPack, etc.

In embodiments, the TDM data module 120 transfers a plurality of data streams to local buffers 110 on a single data channel utilizing time-division multiplexing, where the data streams are transferred appearing simultaneously as sub-channels in one communication channel, but are physically taking turns on the channel. During data transfer, the TDM data module 120 divides the time domain into several recurrent time slots of fixed length, one for each sub-channel. A sample byte or data block of sub-channel 1 (associated with a given data stream) is transmitted during time slot 1, sub-channel 2 during time slot 2, etc. Here, one TDM frame consists of one time slot per sub-channel plus a synchronization channel and sometimes error correction channel before the synchronization. After the data associated with the last sub-channel, error correction, and synchronization is transferred, the cycle starts all over again with a new frame, starting with the second sample, byte or data block from sub-channel 1, etc.

In embodiments, the TDM data module 120 stores the compressed data streams in local buffers 110 using circular buffer memory allocation scheme, where memory is reused (reclaimed) when an index, incremented modulo the buffer size, writes over a previously used location. In embodiments, each data stream (associated with a given audio programming) is stored as a separate data file within the local buffers 110, which can be accessed independent of the other data streams. In embodiments, the RDS data associated with each audio programming is stored along with the data stream of the audio programming as metadata, allowing the audio programming to be searched and retrieved when requested by a user. For example, when a user provided search parameter (discussed in detail later) includes a broadcast station name, the received broadcast station name is compared against the broadcast station name stored as metadata associated with each data stream. When a match is found between the received broadcast station name and the broadcast station name stored as metadata, the data stream associated with the metadata is retrieved and played to the user.

In embodiments, the TDM data module 120 is configured to store each compressed data stream in a dedicated portion of the memory within the local buffers 110, where each dedicated portion is associated with a particular broadcast station. When a user requests audio programming associated with a particular broadcast station, the data stream stored within the dedicated portion of the memory associated with the particular broadcast station is retrieved and played to the user.

In embodiments, the TDM data module 120 can transfer and store the various received audio programming data streams to external storage devices 112, 136 such as SD cards, remote storage servers, other personal computing devices, such as smart phones, tablets, desktop PCs, etc. In embodiments, the TDM data module 120 can transfer the received audio programming data streams to the external storage using wireless connections such as WiFi, WiMax, Bluetooth, 4G LTE communication networks and the like. In embodiments, the TDM data module 120 can transfer the received audio programming data streams to the external storage using wired connections such as Thunderbolt, USB, etc.

In embodiments, the TDM data module 120 manages the different storage mediums as a single storage medium and stores the received audio programming data streams across the storage mediums. In embodiments, the TDM data module 120 utilizes different storage policies across the different storage mediums. In embodiments, the TDM data module 120 implements the circular buffer memory allocation scheme to local buffers 110, allowing it to continually record the audio programming associated with the various broadcast stations at real-time. In embodiments, the TDM data module 120 implements general memory allocation scheme with all other external storage devices 112, 136 such as SD cards, where the TDM data module 120 records the audio programming until the storage devices 112, 136 reach their limit.

In embodiments, the DMM 118 includes an Audio Playback Module (APM) 124 to retrieve and playback the various received audio programming data streams. In embodiments, the APM 124 includes a user interface module (not shown) to enable a user to interact with the audio streaming device 100 through the APM 124, allowing the user to control the content recorded and played back. In embodiments, some of the controls include selection of the broadcast station (and associated audio programming) to be played, audio controls associated with the played audio programming, such as play, pause, rewind, fast-forward, delete, save (to an external storage device for permanent storage), etc., selection of favorite broadcast stations to be recorded, selection of favorite programs in a particular broadcast station to be recorded, selection of favorite songs to be recorded, etc.

In embodiments, the APM 124 maintains a data log to track the actions of the user, such as user play-back related actions, selection and de-selection of favorite broadcast stations, programs and songs, etc. In embodiments, the APM 124 includes a log of one or more functions performed by the APM 124, such as audio programs retrieved and played-back to the user, the number of times a given audio program was played, the broadcast station the user listened to at a given timeframe, search history of one or more searches of audio content performed by the user (discussed later), advertisements listened to by the user as identified from transcribed audio content (discussed later), etc. In embodiments, the APM 124 maintains the data logs in the local buffers 110 under a general memory allocation scheme, where the data logs are managed by a preconfigured data log management policy.

In embodiments, the data log management policy can include a set of default management actions that can be changed at the user's elections. In embodiments, the management policy allows the data logs to be periodically deleted. In embodiments, the management policy allows the data logs to be deleted after the logs have been backed-up in a remote storage (either by the audio streaming device 100 or by a remote storage service that automatically downloads the logs when the audio streaming device 100 can be interacted with through a network).

In embodiments, the user interface module, utilized by the APM 124, is a touch-screen panel that can be utilized by the user to provide the various selections and inputs. In embodiments, the user interface module is a local-area wireless communication module that can interact with various other communication devices to receive the user inputs. The local-area wireless communication module can support various well-known local-area wireless protocols such as Bluetooth, Wi-Fi, wireless IR, etc., allowing a host of communication devices (e.g., a Bluetooth enabled smart phone 138, IR based wireless remote 134, etc.) to interact and provide the APM 124 with user selections and inputs.

In embodiments, the APM 124 retrieves and plays back the audio programming based on the user selection. In embodiments, the APM 124 directly plays the audio programming from the received data streams from the DSP 114 when the user requests the audio programming to be played in real-time (measured with reference to the time of broadcast of the audio programming). In embodiments, the APM 124 retrieves and plays back the audio programming from the local buffer 110 (after decoding using the CODEC 122 when necessary) when the user time-delays the playback of the audio programming (e.g., by pausing the playback or rewinding the point of playback), causing the point of playback to be behind the latest recorded segment of the program. In embodiments, the APM 124 retrieves and plays back the audio programming from the local buffer 110 from preset starting points (e.g., beginning of program) when the audio programming is played for the first time. For example, when the user plays back recorded audio program, the audio streaming device 100 plays the audio program from the earliest recorded portion of the audio program.

Figure 3A:
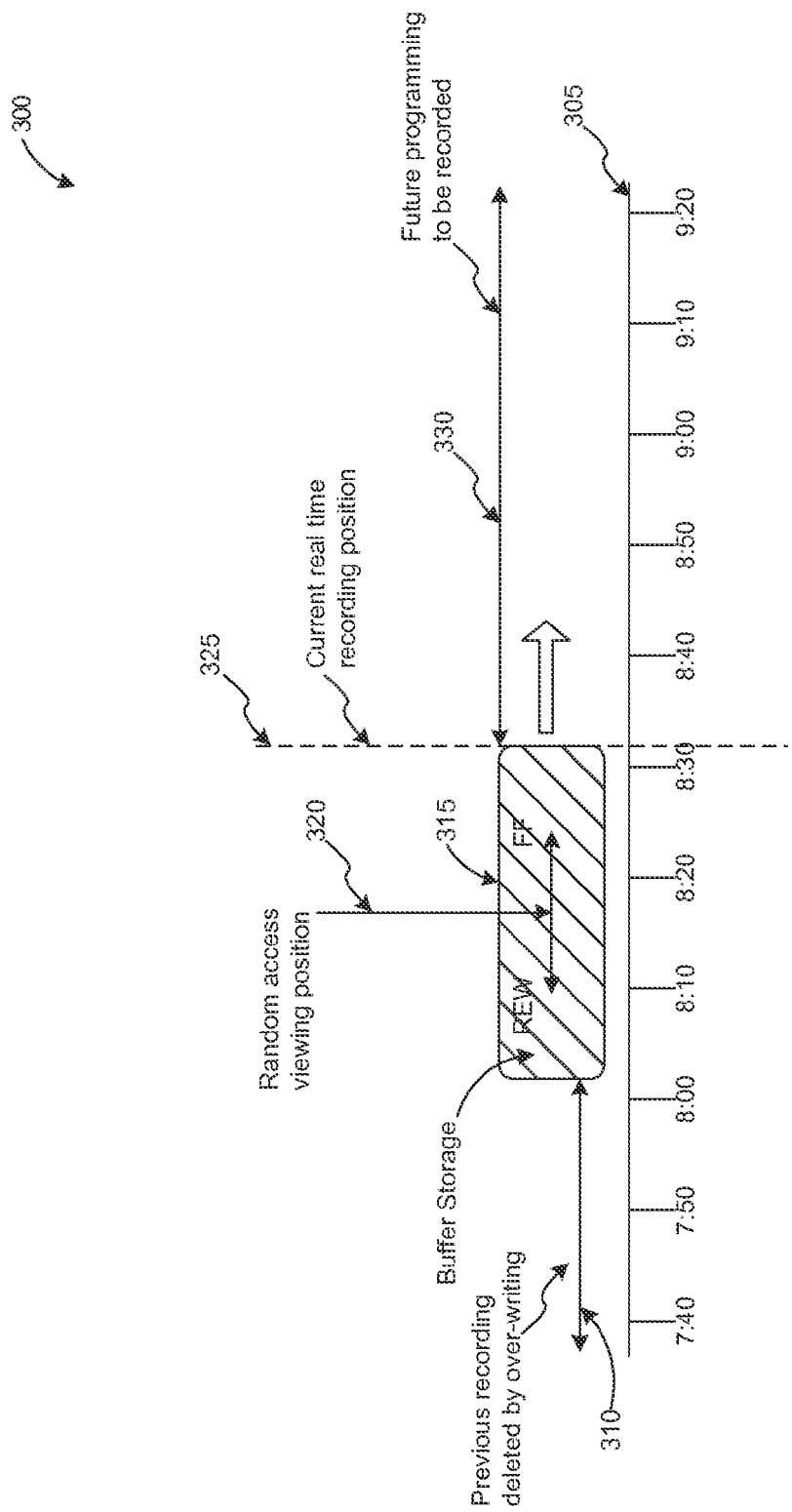
FIG. 3A provides an illustration of circular buffer memory allocation scheme utilized in the audio streaming device to store the demodulated audio programming in the local buffer.
Figure 3B:
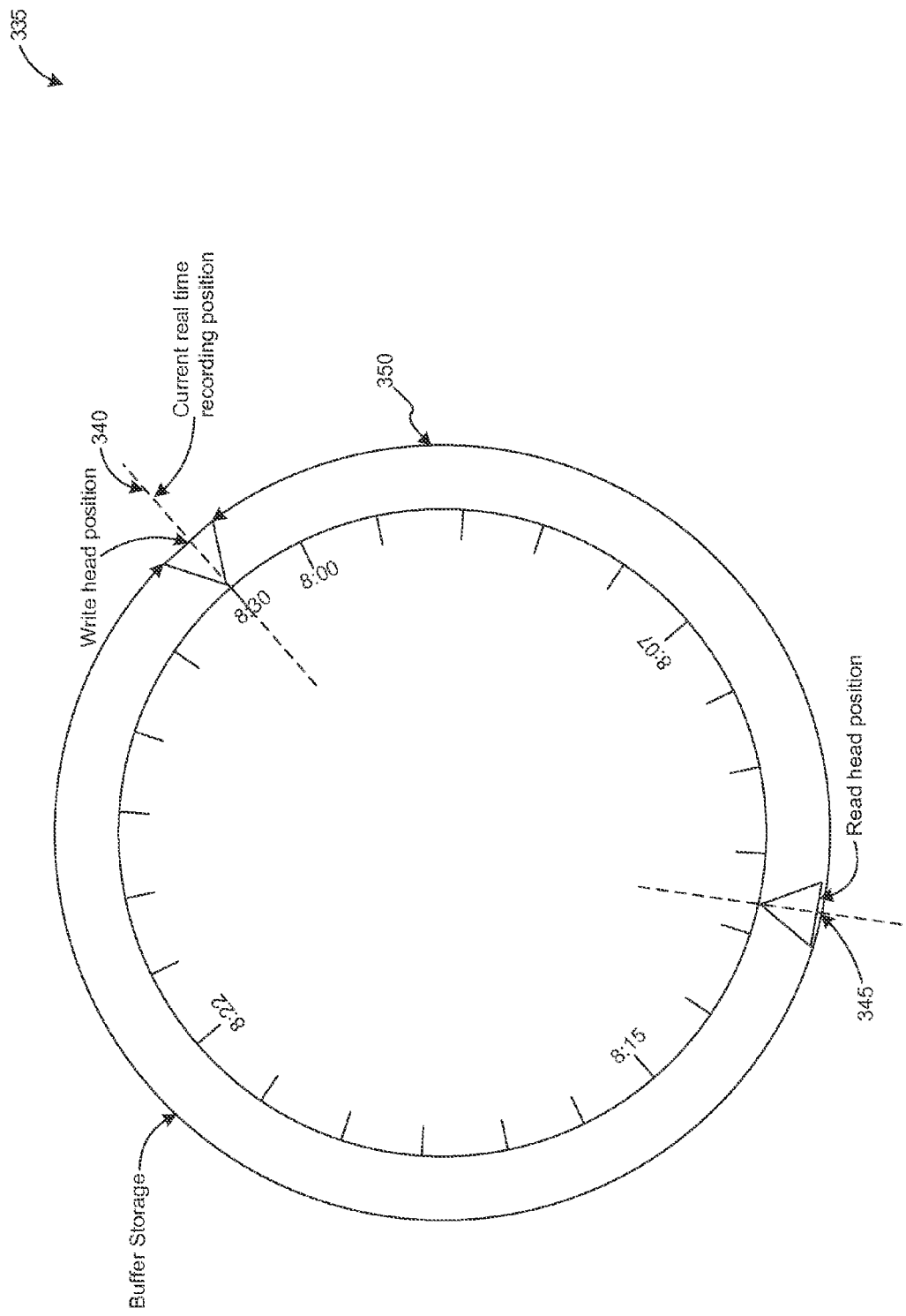
FIG. 3B provides an abstract illustration of the circular buffer memory allocation scheme.

FIGS. 3A and 3B provide additional details of one implementation of how the APM 124 retrieves and plays back the audio programming requested by the user from the local buffer 110.

In embodiments, the APM 124 interacts with the TDM data module 120 to limit the recorded audio programming (by the TDM 120 in the local buffer 110) to only those favorite broadcast stations selected by the user. By recording only those selected broadcast stations, the APM 124 allows the TDM 120 to allocate a greater portion of the local buffer 110 to each of the favorite broadcast stations than would be possible when all or most of the broadcast stations are continuously recorded and stored. The increased memory allocation for each broadcast stations allows the TDM 120 to record and maintain a greater length of the audio programming for the user before a portion of the recorded audio programming needs to be over-written to store the latest audio programming associated with a given broadcast station.

In embodiments, the APM 124 interacts with the TDM data module 120 to record specific audio programming (by the TDM 120 in the local buffer 110) which are selected by the user as favorites. In embodiments, the APM 124 interacts with the TDM data module 120 to utilize a general memory allocation (and not the circular memory allocation scheme) for the user's favorite audio programming, allowing the audio programming to be fully recorded (when possible) and deleted/over-written when the user chooses to. In embodiments, the recorded favorite audio programming are deleted/over-written based on a time-frame, e.g., when the next latest installed on the favorite audio programming is broadcast, and the allocated memory reused.

In embodiments, the user can select the favorite audio programs by providing input associated with the favorite audio programs. Some of the input could include the title of the program, the time slot and the broadcast station the program is telecasted in, etc. In embodiments, the APM 124 continuously monitors the sub-data stream (containing the RDS data) associated with each of the received data streams (of the audio programming) and compares the received input to identify and record the user selected favorite audio programs.

In embodiments, the APM 124 utilizes a communication module (not shown) included within the APM 124 to interact with remote servers 602 or other content servers associated with broadcast stations (not shown) over a network 608 (discussed later) to retrieve electronic programming guides (EPG). The EPGs are digital files that include the audio programming scheduling information for one or more broadcast stations. In embodiments, the APM 124 serves (e.g., displays through a user interface) the content of the EPG to allow the user is select the favorite audio programs that the user wants recorded.

In embodiments, the APM 124 includes an audio-indexing module (not shown) to analyze the content of the audio programming and perform various functions based on the content of the audio programming. In embodiments, the audio-indexing module includes a voice recognition module to transcribe the received audio content into searchable text, indexed by time, allowing the APM 124 to search the received data streams for content associated with the user's favorite audio programs, such as program title, broadcast station name, presenter's name, etc. In embodiments, the voice recognition module can be implemented using any well-known voice recognition algorithms. In embodiments, the APM 124 stores a particular audio programming when a match is found between any portion of the transcribed content and the input provided by the user (as being associated with the user's favorite audio programming).

In embodiments, the APM 124 receives a selection of favorite songs to be recorded from the user. The selection can be provided by the user as titles of the song, the artist associated with the song, the genre of the songs, the lyrics of the song, etc. In embodiments, based on the user provided input, the APM 124 searches the metadata associated with the data streams and the transcribed text of the audio programming to identify the favorite songs of the users and direct the TDM data module 120 record the data streams associated with the identified favorite songs. In embodiments, the APM 124 interacts with the TDM data module 120 to store the identified favorite songs under the general memory allocation scheme, such as in external storage devices such as SD Card 112, allowing the stored favorite songs to be deleted only based on user input.

In embodiments, the APM 124 interacts with the TDM data module 120 and the Codec 122 to ensure the favorite songs are encoded and stored using lossless compression techniques (and preserve audio quality). In embodiments, the APM 124 receives a quality rating of each stored favorite song from the Codec 122, which the APM 124 maintains and tracks to avoid re-recording a favorite song unless the quality rating of the latest recording of the previously stored favorite song exceeds the quality rating of the previously stored favorite song. When the quality rating of the latest recording exceeds the quality rating of the previously stored favorite song, the APM 124 interacts with the TDM data module 120 and the Codec 122 to store the higher quality recording of the favorite song in place of the previously stored lower quality recording of the favorite song.

In embodiments, the APM 124 includes a pattern-recognition module (not shown) to identify user interests and record audio programming based on the identified user interests. In embodiments, the pattern-recognition module can be implemented using any well-known pattern-recognition algorithms. In embodiments, the pattern-recognition module is configured to analyze the listening habits of the user, such as the total time spent by the user listening to a particular audio program, the time slot of the particular audio program, any repetition in user listening of the particular audio program, etc., and identify audio programs that might be of interest to the user. For example, if the user listens to BBC World News on NPR station every weekday from 8:00 AM to 8:30 AM, then the pattern-recognition module would automatically record the BBC World News programming, irrespective of the station broadcast in, as one of the user's favorite audio programs and ensure the programming is not deleted without user input.

In embodiments, the APM 124 directly plays from data streams or plays back previously stored audio programming when the user requests a particular audio programming through the user interface module (as discussed earlier). In embodiments, using the audio-indexing module, the APM 124 transcribes the user requested audio programming into time-indexed searchable text. Using the time-indexed searchable text of the audio-programming, the APM 124 identifies the content of the audio program the user is listening to.

In embodiments, the APM 124 stores one or more metadata, based on the identified content of the audio programming, in the data logs used to track the user's actions and audio preferences. For example, when a program name, such as BBC News, is broadcast in the first few minutes of the airing of the program, the name, from the transcribed text, is stored in the data log identifying the program the user was listening to at the given time. In embodiments, the APM 124 stores one or more metadata associated with any identified ad content that is broadcast within an audio program and listened to by the user in the data logs. Such information can allow the effective measurement of the ads the user actually listened to.

Further, using the time-indexed searchable text of the audio-programming, the APM 124 allows the user to perform text search and playback the audio programming from a playback point where a positive match was found between the searched text and the content of the audio programming. When multiple instances of positive matches are found, the APM 124 plays the audio programming starting from the first positive match.

In embodiments, the APM 124 allows the user to skip the audio programming from one instance of the match to the next with a skip function. In embodiments, the skip function can be implemented as a set of instructions, allowing the APM 124 module to perform the functions associated with the skip function when. For example, if the user is listening to a previously recorded cooking show and wants to find out the particular temperature to set the oven at, the user can simply search using text "temperature" and "oven" and index to the point of the cooking show where the content of the show discusses "temperature" and "oven" instead of repeatedly forwarding, rewinding and playing back the cooking show to find out the content of interest. As discussed above, the searched texts are stored in the data logs as part of user's search history in the data logs.

In embodiments, the APM 124 includes a digital to analog converter (D/A) (not shown) to convert the stored audio programming into analog audio signals that can be played over any audio speaker to reproduce the audio programming. In embodiments, the audio programming is reproduced using internal speakers included within the audio streaming device 100. In embodiments, the converted analog audio signals of the audio programming are provided over a communication interface (not shown) included in the APM 124, such as through an audio line out from the audio streaming device 100. In embodiments, the converted analog audio signals are sent wirelessly, by a communication module (not shown) included in the APM 124, after proper modulation for the particular wireless protocols, such as Bluetooth, FM, etc.

Figure 2:
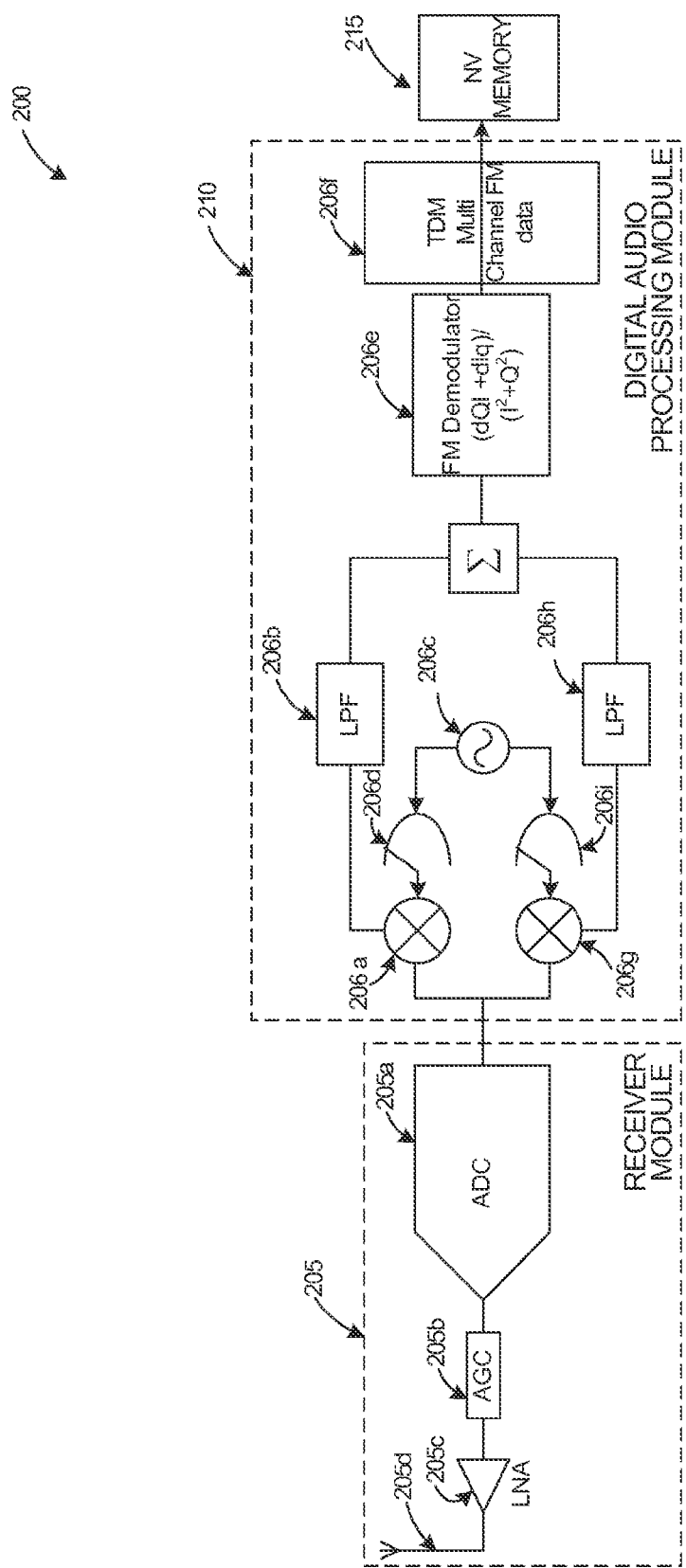
FIG. 2 provides an implementation of audio streaming device for processing the audio programming broadcast over the FM band.

The following discussion, illustrated with FIG. 2, provides one implementation 200 of processing the audio programming broadcast over the FM band in the audio streaming device 100. As discussed earlier, in embodiments, the audio streaming device 100 includes a receiver module 205. The receiver module 205 receives the transmitted analog RF signal carrying the modulated audio programming in FM band signals. The receiver module includes an antenna 205*d* to receive the transmitted RF signal (in the FM broadcast frequency range of 87.5 MHz to 108.0 MHz) and a Low-Noise Amplifier (LNA) 205*c* to amplify the received RF signal. The receiver module further includes an Automatic Gain Control (AGC) module to adjust the gain, after amplification, to an appropriate level for the received RF signal as required by the Analog to Digital Converter (ADC) 205*a*.

In embodiments, the ADC 205*a* converts the received analog RF signals into digital format, which can then be digitally processed to select and extract (i.e. demodulate) the various embedded audio programming associated with various broadcast channels. In embodiments, the ADC 205*a* converts the full band of RF analog signal into full band of RF analog signal in digital format. In embodiments, applying the Nyquist's criterion, the ADC 205*a* samples the RF analog signal to be digitized at least at twice the bandwidth of the RF analog signal to be digitized, allowing the RF analog signal to be reconstructed using the digitized data.

For example, operating at a sampling frequency of 200 MHz, the ADC 205*a* can digitize the RF analog signal with a bandwidth of up to a 100 MHz. In embodiments, the ADC 205*a*, utilizing well-known under-sampling techniques, can digitize the RF analog signal by sampling the aliased image of the RF analog signal, where the aliased image of the RF analog signal appears at a lower frequency that the actual RF analog signal. By sampling the lower frequency aliased image of the RF analog signal, the ADC 205*a*, operating at a frequency far less than that required by the Nyquist's criterion, can successfully digitize the RF analog signal.

In embodiments, the audio streaming device 100 includes a Digital Audio Processing (DAP) module 210 (also referred to as the PDT 108) to receive the digitized RF signal and demodulate the audio programming of each FM broadcast channel embedded within the digitized RF signal. In embodiments, the DAP 210 and its various functions can be implemented by a general purpose microprocessor, a field programmable gate array (FPGA), an application specific integrated circuit (ASIC) and/or any commercially available digital signal processor.

In embodiments, the DAP module 210 receives the digitized RF signal and demodulates the audio programming embedded in the digitized RF carrier signal. In embodiments, the DAP 210 includes a Direct Digital frequency Synthesizer (DDS) (also referred to as the Numerically Controlled Oscillator (NCO)), which includes the digital oscillator 206*c* and the frequency selector 206*d*, 206*i*, and digital mixers 206*a*, 206*g*, all implemented using digital circuitry. The DDS generates digital samples of two sine waves offset by 90 degrees in phase, creating sine and cosine signals, where the frequency of the sine and cosine signals are set by the frequency selector 206d, 206i respectively.

The digital mixers 206a, 206g then mixes (i.e. mathematically multiply) the sine and cosine signals, respectively, with the received digitized RF signals to produce in-phase (I) and quadrature (Q) outputs with a frequency shift equal to the frequency of the sine and cosine signals (i.e. the signals from the DDS). The DDS and digital mixers 206a, 206g, thus, allow a particular portion (associated with a particular FM broadcast station) of the digitized RF signal to be down converted to a lower intermediate frequency (IF) before further processing of the digitized RF signal. For example, by tuning the DDS over its frequency range, any portion of the RF input signal can be shifted around 0 Hz. By down converting, the DAP module 210 can not only process the digitized RF input signal at a lower frequency of 0 Hz but also select and demodulate RF signal associated with particular FM broadcast station by simply limiting the processing to RF signals centered around the 0 Hz. So, by tuning the DDS over its frequency range, each broadcast station can be centered around the 0 Hz independently and demodulated for the audio programming associated with the particular broadcast station.

In embodiments, the DAP module 210 includes a decimating low pass digital filter 206b, 206h (e.g., a finite impulse response filter (FIR)), implemented as a set of executable instructions, to receive the down-converted in-phase (I) and quadrature (Q) outputs and select/filter a portion of outputs associated with a given broadcast channel (e.g., broadcast channel of a particular radio station centered around 0 Hz). In embodiments, the decimating low pass digital filter 206b, 206h can be programmed to allow only portions of the I and Q signals with frequency greater than 0 Hz but less than 20 KHz (representing the bandwidth of a particular FM broadcast station) and reject all higher frequencies. It should be noted that the decimating low pass digital filter 206b, 206h is provided as a non-limiting example. Any well-known digital filter that can perform the function of the decimating low pass digital filter 206b, 206h can be utilized to select/filter the portion of output signals associated with the given broadcast channel.

In embodiments, the DAP module 210 includes a digital demodulator 206e to demodulate (i.e. extract) the audio programming and any digital data (transmitted along with the audio programming) from the filtered portion of I and Q output signals associated with a particular FM broadcast channel. The digital demodulator 206e is implemented as various algorithms (i.e. as a set of executable instructions), such as frequency discriminator algorithm, to perform demodulation of the frequency modulated I and Q output signals. In embodiments, the digital demodulator 206e is implemented as a function of $(dQI+dIq)/(I^2+Q^2)$, where I and Q are the filtered in-phase and quadrature output signals. In embodiments, the DAP 210, operating at a faster data rate than the frequency of the demodulated RF signal, serially down-converts RF signal associated with each FM broadcast station and demodulates the embedded audio programming from the down-converted RF signal before repeating the demodulation with the next sample of received RF signal from the receiver module 205.

In embodiments, the audio streaming device 100 includes a Time Division Multiplexing (TDM) data module 206f to compress and store the various received audio programming data streams in non-volatile memory 215 (e.g., SD Card). As discussed earlier, in embodiments, the TDM data module 120 transfers a plurality of data streams to local buffers 110 on a single data channel utilizing time-division multiplexing, where the data streams are transferred appearing simultaneously as sub-channels in one communication channel, but are physically taking turns on the channel. In embodiments, the TDM data module 120 stores the compressed data streams in local buffers using circular buffer memory allocation scheme, where memory is reused (reclaimed) when an index, incremented modulo the buffer size, writes over a previously used location.

The following discussion, illustrated with FIGS. 3A and 3B, provides additional detail regarding the circular buffer memory allocation scheme 300 utilized in the audio streaming device 100 to store the demodulated audio programming in the local buffer 110. In FIG. 3A, the timeline 305 of recording of a particular audio programming is shown. The timeline 305 is divided into two portions by the current real-time recording position 325 (measured relative to the time of broadcast of the recorded audio programming) of the audio programming. The timeline 305 to the left of the current real-time recording position 325 represents the previously broadcast (and possibly recorded 315) portion 310 of the audio programming. The timeline 305 to the right of the current real-time recording position 325 represents the audio programming yet to be broadcast 330 (and likely to be recorded when broadcast).

As discussed earlier, in embodiments, a given broadcast channel (and its associated audio programming) is allocated a fixed portion of local buffer 110 under the circular buffer memory allocation scheme, where memory is reused (reclaimed) when an index (i.e. the current real-time recording position 325), incremented modulo the buffer size (i.e. the total audio programming recording from 8:00 to 8:30), writes over a previously used location. As shown in FIG. 3A, the total buffer allocated for given broadcast channel contains the audio programming recording from 8:00 to 8:30, allowing the user the rewind or fast-forward within the presently available buffered portion of the audio programming recording. As the index (i.e. the current real-time recording position 325) moves to record the audio programming past the 8:30 timeline, the audio programming associated with the 8:00 timeline will be over-written and the currently buffered programming will be from 8:01 to 8:31 timeline of the audio programming.

FIG. 3B provides an abstract illustration of the circular buffer memory allocation scheme 335, where the timeline of the buffered programming ranges from 8:00 to 8:30. The current real-time recording position of the audio programming is associated with the position of the write head 340 within the allocated portion of the buffer and the position of the audio programming being read (8:12) is represented by the read head 345 within the buffered programming 350. As the position of the write head 340 moved forward, the audio programming associated with timeline 8:00 is over written with audio programming associated with timeline 8:31 and the buffered programming 350 within which the read head 345 moves is shifted to timeline 8:01 to 8:31. Note that the FIG. 3B simply provides an abstract illustration of the circular buffer memory allocation scheme 335 and by no means implies anything about the physical shape or structure of the memory implementing the circular buffer memory allocation scheme 335.

Figure 4A:
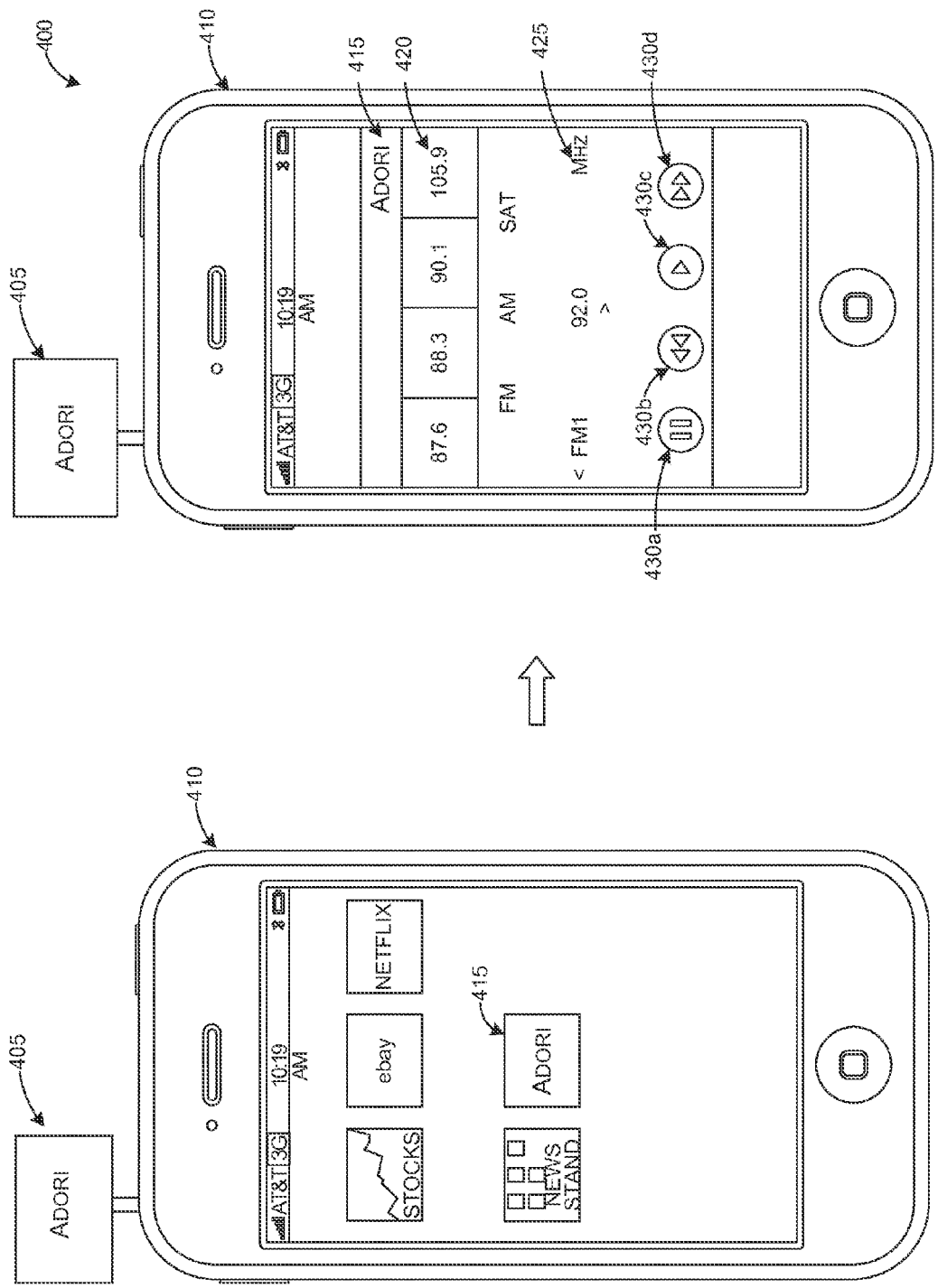
FIG. 4A provides an exemplary embodiment of the audio streaming device implemented utilizing a smartphone and a dedicated hardware.
Figure 4B:
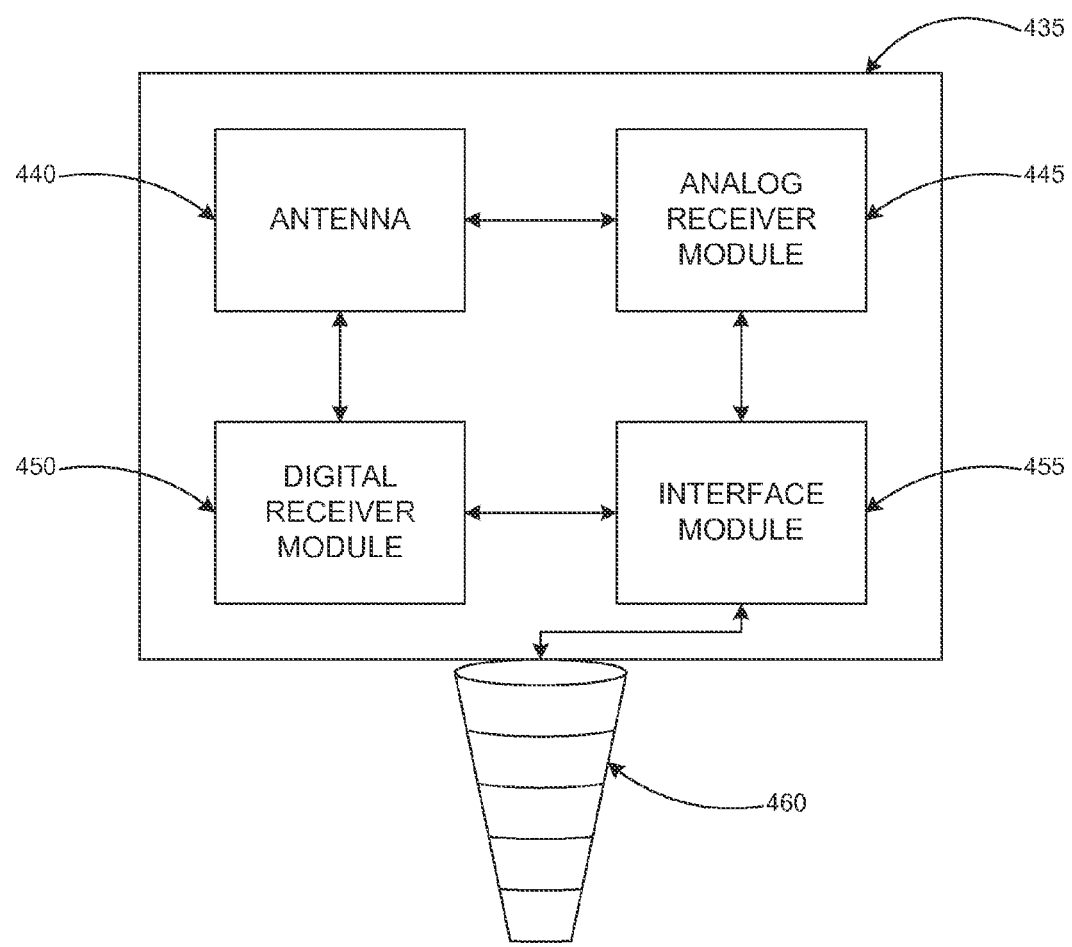
FIG. 4B provides an exemplary embodiment of the dedicated hardware.
Figure 4C:
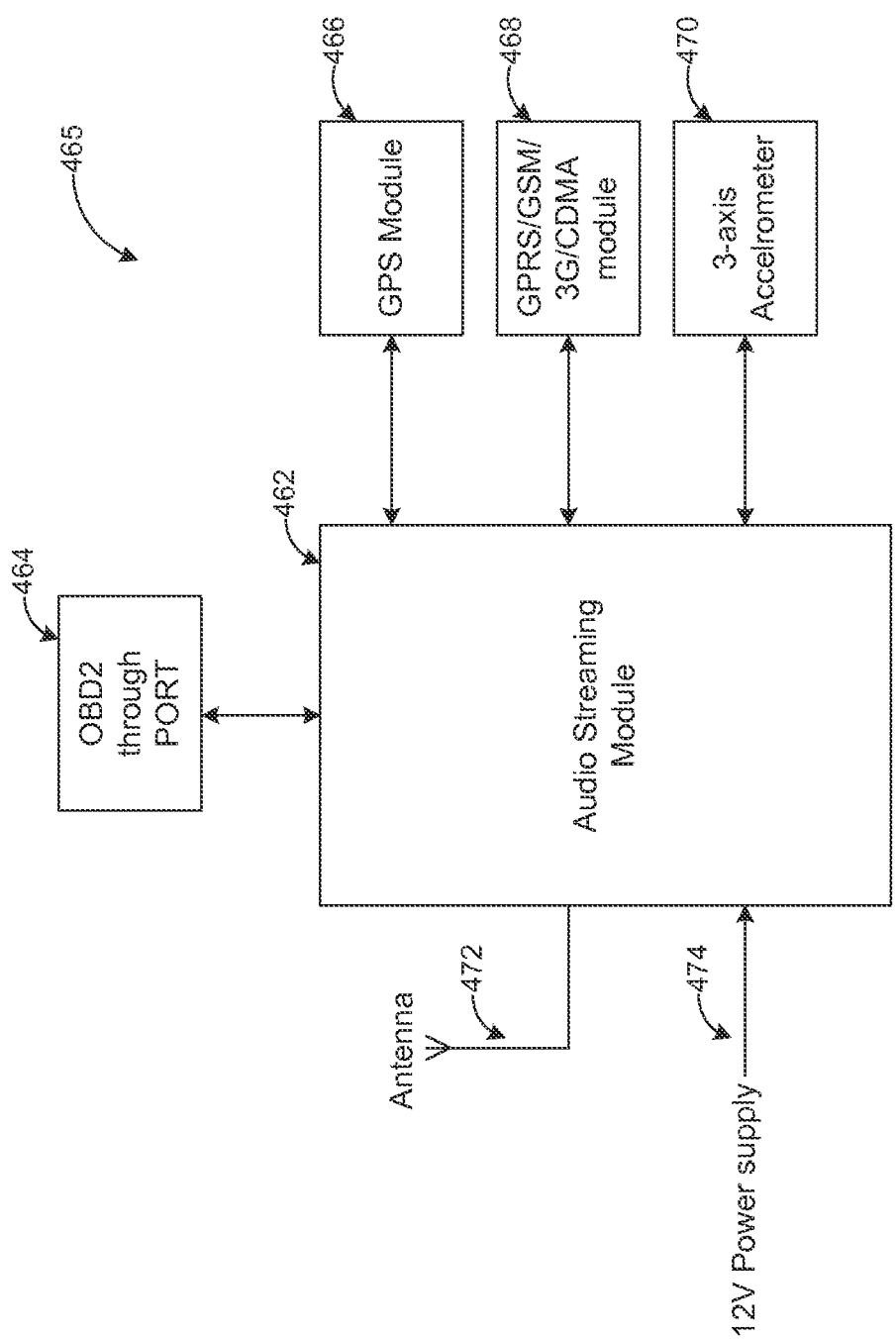
FIG. 4C provides an exemplary embodiment of the audio streaming device implemented as a stand-alone device integrated with other modules to provide added functionalities to the audio streaming device.

FIG. 4, which includes FIGS. 4A, 4B and 4C, provides exemplary embodiments of the audio streaming device 100. In one exemplary embodiment 400, the audio streaming device 100 is implemented using the hardware and software components of a smartphone 410 (e.g., Apple iPhone) and a dedicated hardware 405 interfaced with the smartphone 410 (e.g., through a general communication jack). In the embodiment 400, the dedicated hardware 405 includes hardware and software that can be plugged into the smartphone 410 to add functionalities to the audio streaming device 100. The added functionalities could include functionalities not supported by the available hardware and software of the smartphone 410. The added functionalities could also include functionalities that can be performed more efficiently (e.g., faster and using less power) using the dedicated hardware 405 than using the available hardware and software of the smartphone 410.

In embodiment 400, the dedicated hardware 405, 435, illustrated in FIG. 4B, includes the antenna 440,104, the analog receiver module 445, 102 and the digital receiver module 450, 106 of the audio streaming device 100 (described above with reference to FIG. 1) and an interface module 455 to enable the dedicated hardware 405, 435 to interact with the smartphone 410. The interface module 455 in turn communicates with the smartphone 410 through a physical jack 460 to receive power (to power the dedicated hardware 405, 435) and to send and receive communication from the smartphone 410.

In embodiment 400, the PDT 108 is implemented as a software application (also referred to as the "app"), which can be installed on a smartphone. The PDT 108 utilizes the touch-panel of the smartphone 410 as the user interface module to receive user inputs, such as the audio programming to retrieve and play 425, the favorite broadcast channels to record 420, play-back control inputs such as play 430c, pause 430a, rewind 430b, fast-forward 430d, etc., the favorite broadcast programming to record, the favorite songs or genre to record, etc. In embodiment 400, the DSP 114, the serializer 116, the DMM 118 and other modules of the PDT 108 are implemented as sets of instructions, executing in the background and supporting the various functionalities of the audio streaming device 100.

In embodiment 400, in some implementations, the PDT 108 runs in the background even when the app 415 is not invoked by the user, allowing recording of the audio programming silently in the background. In embodiment 400, in some implementations, the PDT 108 includes a background process that implements a portion of the PDT 108, such as monitoring the data streams for user interested content, and invokes the rest of the app 415 when a user interested content is found. The app 415 then records the identified user interested content in the local buffer or any non-volatile memory associated with the smartphone 410, such as internal hard drive, flash drives, any external storage devices, etc.

FIG. 4C provides another exemplary embodiment 465 of the audio streaming device 100, where the audio streaming device 100 is implemented as a stand-alone device 465. As discussed above, the stand-alone audio streaming device 465 includes all the functionalities of the audio streaming device 100 implemented as shown in embodiment 400. In embodiments, the stand-alone audio streaming device 465 includes an audio streaming module 462 within which the audio streaming device 100 related functionalities are implemented. The antenna 472 receives the RF signals for the audio streaming module 462 and the power supply 474 acts as the power source (e.g., 12V DC) for the audio streaming module 462.

In embodiments, the stand-alone audio streaming device 465 includes additional components to provide added functionality to the audio streaming device 100. In embodiments, the stand-alone audio streaming device 465 includes dedicated wireless communication modules, GPS modules and vehicle monitoring modules. In embodiments, the dedicated wireless communication module 468 includes hardware and software components to enable one or more wireless communication channels based on protocols such as GSM, CDMA, LTE, GPRS, 3G, other IP-based communication protocols for LAN (e.g., Wi-Fi), etc. The communication module 468 enables the stand-alone audio streaming device 465 to communicate using Wi-Fi or other cellular based communication network, allowing the stand-alone audio streaming device 465 to not only share any user related information with other remote services but also be remotely configurable by the user.

In embodiments, the GPS module 466 of the stand-alone audio streaming device 465 allows the current location of the audio streaming device 465 and any object (e.g., vehicle) within the proximity of the audio streaming device 465 to be tracked. The GPS determined location of the stand-alone audio streaming device 465 can be received through the communication module 468. In embodiments, the GPS location can be utilized to track vehicles (when audio streaming device 465 is within vehicle), such as locate a parked vehicle, track a stolen vehicle and other geo-fencing based functionalities. In embodiments, the stand-alone audio streaming device 465 includes a multi-axis accelerometer 470 to provide information such as rapid acceleration, harsh braking (relative to a preconfigured threshold), motion of the vehicle (in proximity of the audio streaming device 465) when engine not running, (e.g. towing alert), etc.

In embodiments, the stand-alone audio streaming device 465 includes a OBD2 (On-Board Diagnostics 2) communication interface to interact with any vehicle through the OBD2 port of vehicle. The OBD2 port enables the stand-alone audio streaming device 465 to gather vehicle related information that are authorized by the manufacturer of the vehicle to be shared. In embodiments, the stand-alone audio streaming device 465 can gather information such as Vehicle Identification Number ("VIN") of the vehicle, any recorded instances of excessive engine speed (measured as RPM of the engine), vehicle speed, vehicle battery voltage (which can be used to provide low battery warning), check engine light (shown as MIL alert), odometer (e.g., trip distance), engine idle time, any low fuel alert, etc.

In embodiments, the stand-alone audio streaming device 465 can be integrated with additional off the shelf modules (e.g., sensors) to provide added vehicle diagnostics and other functionalities to the user of the stand-alone audio streaming device 465. The above provided modules are simply some of the modules that can be integrated with the stand-alone audio streaming device 465 to provide additional functionalities to the user and therefore in no way limit the scope of the modules that can be integrated with the stand-alone audio streaming device 465 to just those discussed above.

Figure 5:
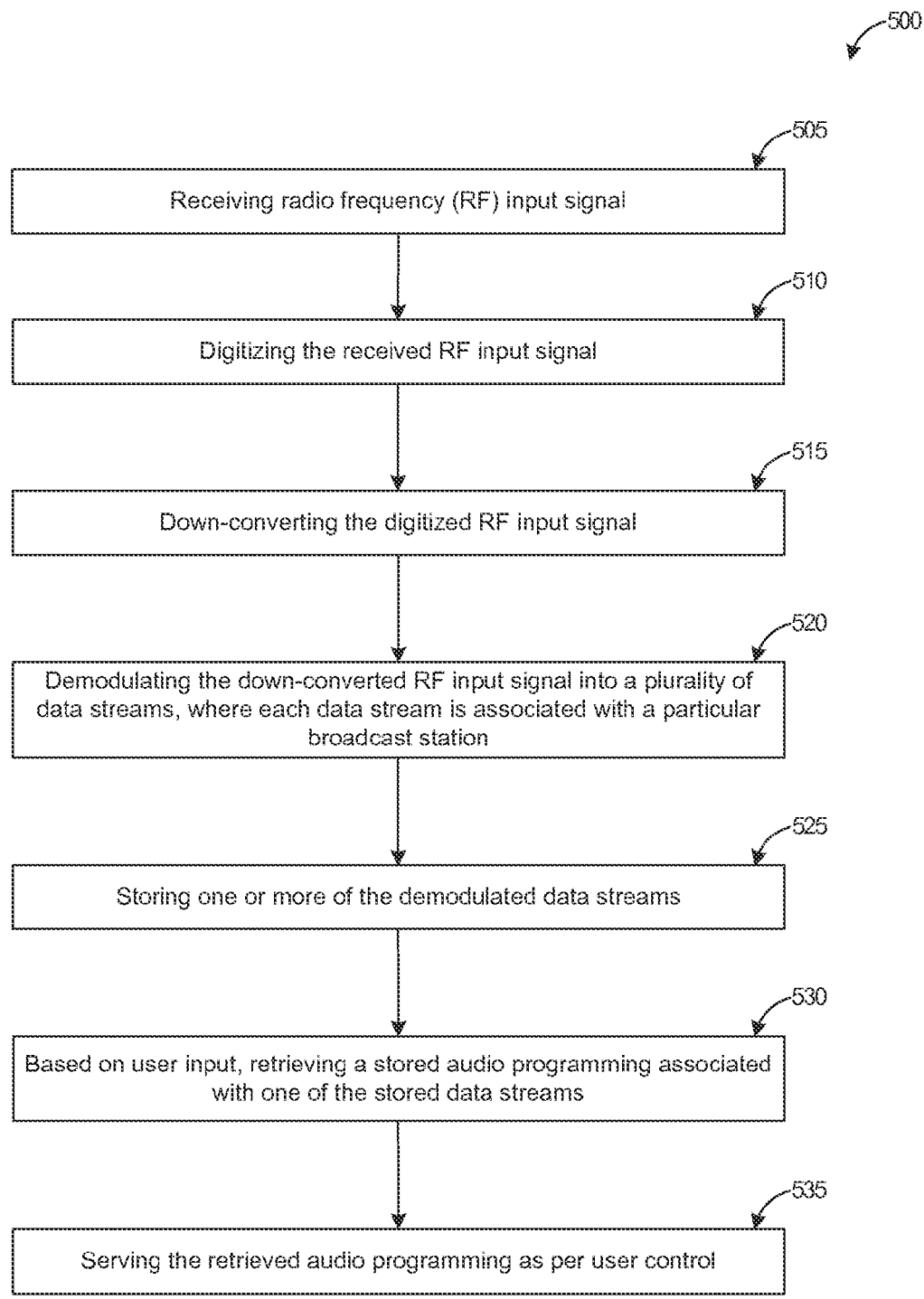
FIG. 5 is a flow chart illustrating a method 500 for recording a full band of audio programming associated with a plurality of broadcast channels and playing back the recorded audio programming in response to a user request.

FIG. 5 is a flow chart illustrating a method 500 for recording a full band of audio programming associated with a plurality of broadcast channels and playing back the recorded audio programming in response to a user request. In step 505, a full bandwidth of radio frequency (RF) signals carrying the embedded audio programming is received. In step 510, the full bandwidth of received RF signals is digitized using an Analog to Digital Converter. In step 515, the digitized RF signals are down-converted to an intermediate frequency for easier processing. In step 520, the down-converted RF signals are demodulated into a plurality of data streams, where each data stream is associated with a particular broadcast station. In step 525, one or more of the demodulated data streams are stored in a local buffer based on user selection. In step 530, based on received user input, retrieving a stored audio programming associated with one of the data streams from the local buffer. In step 535, the retrieved audio programming is served to the user based on user input.

Figure 6:
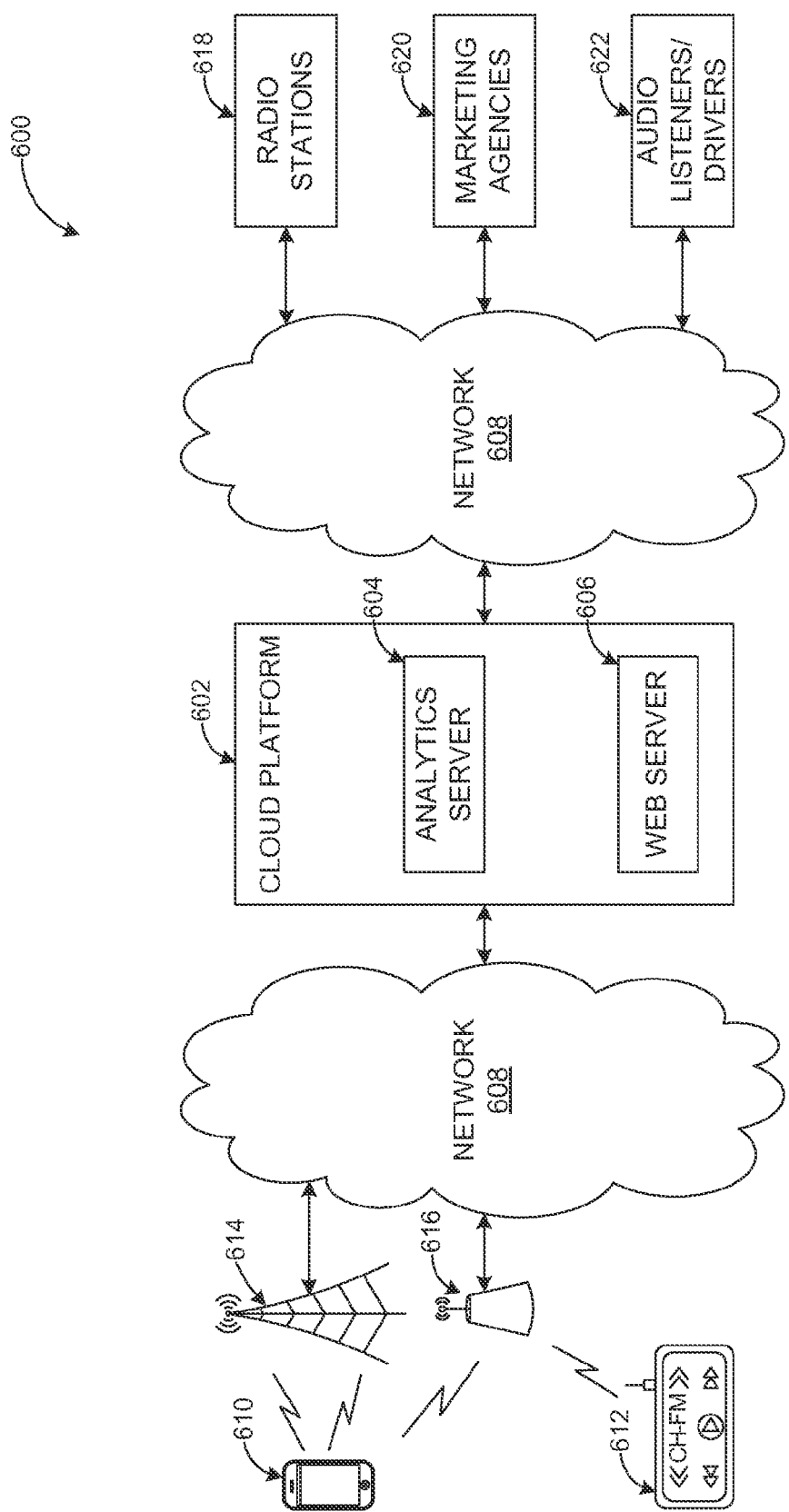
FIG. 6 describes the various audio listener related analytics that are performed by a remote platform on the various audio listener related information stored in the audio streaming device.

FIG. 6 describes the various audio listener related analytics that are performed by a remote platform 602 (e.g., a cloud based service) on the various audio listener (also simply referred to as the "user") related information stored in the audio streaming device 100. Such analytics could help provide the listener with customized content while enabling any interested party, such as radio stations, marketing agencies, etc., with insight into the listener preferences (possibly with the consent of the listeners), reach of a given broadcast program, reach of a given ad campaign conducted over one or more radio stations, etc.

In some embodiments, the audio playback module (APM) 124 maintains a data log, stored to track the various user actions performed by a given user using the audio streaming device 100. Some of the tracked and recorded user actions could include tracking the audio channel the given user is listening to at a given time, the songs and programs the given user recorded, the songs and programs the given user replayed, the channels on the given user's favorite list, any content search performed by the given user, etc.

In some embodiments, as discussed above, the audio streaming device 100 includes additional modules, such as a vehicle communication module 464 (e.g., OBD2 protocol based vehicle communication module), a tracking module 466 (e.g., a GPS-based navigation/tracking module), a wireless communication module 468 (e.g., a GPRS/GSM/3G/CDMA wireless protocol supporting communication chip), a multi-access accelerometer module 470, etc., which allow the audio streaming device 100 to track and record a user's vehicle operation when the audio streaming device 100 is within the vicinity of the user's vehicle.

In embodiments, the APM 124 maintains a vehicle-operation related data log to track various parameters related to a user's performance in operation of a vehicle. Some of the tracked parameters can include the acceleration tendencies of the driver (i.e. the user of the audio streaming device 100), the braking tendencies of the driver, speeding tendencies of the driver, etc. Some of the other vehicle and vehicle-condition related parameters that are tracked and recorded can include the current location of the vehicle, status alerts (e.g., check engine light (MIL alert)), excessive engine speed (RPM) warnings, vehicle speed, vehicle battery voltage and related low battery warning, odometer readings (e.g., trip distance readings), idle time reporting, low fuel alerts, vehicle identification number, etc.

In embodiments, the stored data logs can be used to perform various user and user vehicle related analytics. In some embodiments, the APM 124 of the audio streaming device 100 performs the various user and user vehicle related analytics and provides the results to the user. The results could either be displayed to the driver through a display module included in the audio streaming device 100 or be transmitted to any devices (e.g., a smart phone or any computing device) associated with the user through the network (e.g., network 608 in FIG. 6). For example, an App in a smart phone associated with the user may be configured to receive the results from the APM 124 through the network. The user can then retrieve the results through their smart phone even when the audio streaming device 100 is physically inaccessible to the user (e.g., when the audio streaming device 100 is in the vehicle and the user/driver is away from the vehicle).

In some embodiments, the APM 124 transmits the gathered data to any requesting service and allows the requesting service to perform the various user and user vehicle related analytics and provide the results to the user. In one instance, the requesting service could be a cloud-based service with an associated App installed on a computing device (e.g., the user's smart phone) of the user. The cloud-based service can perform the analytics and provides the results to the App, which can then be retrieved by the user through the computing device.

FIG. 6 and the following discussion provide a brief, general description of a remote platform 602 (i.e. a cloud-based service), also referred to as a cloud platform, which can be utilized to perform the user and user vehicle related analytics.

As shown in FIG. 6, a variety of systems and devices can interact with the cloud platform 602 through the network 608 to provide data related to a given user's listening preferences and a given user's vehicle condition. Further, a variety of systems and devices can interact with the cloud platform 502 to retrieve results of the various user and user vehicle related analytics performed by the cloud platform 502 using the received data. As discussed above, in some embodiments, a stand-alone audio streaming device 465, 612 utilizes a communication module 468 to interact with the cloud platform 602 via the network 608. Similarly, in some embodiments, a smartphone based audio streaming device 400, 610 utilizes the smartphone's 410, 610 communication platform to interact with the cloud platform 602 via the network 608.

In one example, the audio streaming device 610, 612 utilize the communication module to connect to the network 608 using one or more cellular transceivers 614 or base station antennas (in cellular implementations), Wi-Fi access points 616, terminal adapters, routers or modems (in IP-based telecommunications implementations), or combinations of the foregoing (in converged network embodiments). In the context of this description, information communicated may include, for example, data related to a user's audio listening preferences and a user's vehicle related information. In embodiments, the audio streaming device 610, 612 can be configured to utilize the Wi-Fi network for communicating with the cloud platform 602 (through the network 608) when both the Wi-Fi network and cellular network are available.

In embodiments, the network 608 is the Internet, allowing a user's computing device 622 (with, for example, WiFi capability), an broadcast station's computer system 618, or a marketing agency's computer system 620 to access analytics results available via various servers (e.g., web server 606) of the cloud platform 602 connected via the network 608. In some instances, the user's computing device 622 is a phone and the phone is used to access web content through the network 608 (e.g., when a 3G or an LTE service of the phone is used to connect to the network 608).

The network 608 may be any type of cellular, IP-based or converged telecommunications network, including but not limited to Global System for Mobile Communications (GSM), Time Division Multiple Access (TDMA), Code Division Multiple Access (CDMA), Orthogonal Frequency Division Multiple Access (OFDM), General Packet Radio Service (GPRS), Enhanced Data GSM Environment (EDGE), Advanced Mobile Phone System (AMPS), Worldwide Interoperability for Microwave Access (WiMAX), Universal Mobile Telecommunications System (UMTS), Evolution-Data Optimized (EVDO), Long Term Evolution (LTE), Ultra Mobile Broadband (UMB), Voice over Internet Protocol (VoIP), Unlicensed Mobile Access (UMA), etc.

As discussed above, in some instances, a user uses one of the computing devices (e.g., a phone, a personal computer, etc.) to connect to the cloud platform 602 through the network 608. In one embodiment, the cloud platform 602 comprises an analytics server 604 coupled to a local database (not shown in FIG. 6). The term "analytics server" as indicated herein, refers to an individual or multiple server stations or other computing apparatus. In one embodiment, the analytics server 604 is a web server capable of hosting a website and generating and storing content (e.g., various webpages) that is associated with the website. In some embodiments, the analytics server 604 is separate from a web server 606, but communicates with a web server 606 to generate, provide, manage, and/or control content (e.g., user and user vehicle related analytics) provided by the web server 606.

In embodiments, the analytics server 604 includes various modules (either implemented as software or in hardware) that collects user and user vehicle related information from various systems and devices 610, 612 and coordinates and provides the results of the various analytics performed by the analytics server 604 on the received data to end systems 618-622. In embodiments, the analytics server 604 generates user specific analytics and aggregated analytics, where the aggregated analytics is based on gathered data of one or more users utilizing the audio streaming device 610, 612.

In embodiments, the cloud platform 602 limits the sharing of the results of the user specific analytics to the particular user whose data logs were used to generate the results and to the third parties authorized by the particular user (e.g., the particular user's auto-repair facility). Some of the user specific analytics performed by the analytics server 604 can include user listening preferences, driving performance analysis, vehicle diagnostics, vehicle tracking information, etc. In embodiments, the analytics server 604 may independently coordinate the processing and eventual servicing of user's computing device's 622 requests for results from the various analytics.

In embodiments, the aggregate analytics is performed on the gathered data of one or more users utilizing the audio streaming device 610, 612 and the results of the aggregate analytics are shared with third parties, such as broadcast stations 618, marketing agencies 620, etc. Some of the aggregate analytics performed by the analytics server 604, specifically for marketing agencies 622 to aid in market research, includes: (1) total reach (i.e. number of listeners) of a given broadcast station at a given timeframe (within a geographical reach of the given broadcast station); (2) a demographic reach of each of one or more broadcast stations (within the geographical reach of the broadcast stations); (3) ad campaign related reports that include cost and effective reach of the ad campaign (within the geographical reach of the broadcast stations the ad campaign was implemented through), etc.

Some of the aggregate analytics performed by the analytics server 604, specifically for broadcast stations 618 to aid in understanding users' interest, includes: (1) effective reach (i.e. number of listeners) of a given program broadcast by a given broadcast station (within a geographical reach of the given broadcast station); (2) user action logs capturing listening habits of one or more users of a given broadcast station; (3) top songs/programs recorded; (4) top songs/programs replayed; (5) top stations on users' favorite list; (6) top search terms by users of the audio streaming device 100, 610, 612, etc. In embodiments, the analytics server 604 may independently coordinate the processing and eventual servicing of end system 618, 620 requests for any of the results from the various aggregate analytics as defined by policy settings on the cloud platform 602.

For example, the aggregate analytics results, which do not identify specific users and comprise their privacy, may be shared across with any platform authorized third party while user specific analytics results may only be shared with users associated with the specific analytics results and their authorized third parties. As will also be explained in further detail herein, the cloud platform 602, which includes the analytics server 604 and the web server 606, incorporates one or more functional units to achieve each of the above discussed functionalities.

As discussed earlier, the cloud platform 502 receives user and user vehicle related information from audio streaming devices 100, 610, 612. In some embodiments, the cloud platform 602 creates and associates a user profile for each audio listener, where the user profile is used to store the various user and user vehicle related information received from a given user's audio streaming device 100, 610, 612.

In some embodiments, the cloud platform 502 utilizes a user image (e.g., an image of the user taken using the smartphone 610 performing as the audio streaming device) associated with a user profile in the audio streaming device 100, 610, 612 to create and associate the user related information from a user's audio streaming device 610, 612, including user identity related information such as age, gender, ethnicity, etc., to the appropriate user profile. The cloud platform 602 can perform facial recognition using the received image and the user image (if available) from each of the user's audio streaming device 610, 612 (when a single user owns multiple audio streaming devices 100). In another embodiment, the cloud platform 502 can utilize a user name and other identification information (provided earlier by a given user or other sources) to create, match and associate a user profile with the information from the various audio streaming device 610, 612 associated with the given user.

In some embodiments, the cloud platform 602 receives information gathered by the APM 124 in the data logs as discussed earlier. Some of the information includes the various data gathered by the APM 124 when performing one or more functions by the APM 124 for the user as discussed earlier. For example, the APM 124 provides the cloud platform 602 with information relating to the audio programming listened to by a given user at a given time (refer to FIG. 1 for more detail). The received information relating to the audio programming listened to from the one or more APMs 124 of one or more audio streaming devices 100 (associated with one or more users) can be utilized to determine the effective reach of any given broadcast station. In embodiments, the data collected from the users with the audio streaming devices 100 serve as the representative sample for the wider audio listeners (e.g., radio broadcast listeners), making the effective reach of a given broadcast station determined based on the users with the audio streaming devices 100 representative of the wider audio listeners.

As discussed above, in embodiments, the cloud platform 602 performs aggregate analytics on the data of various users (stored on user accounts associated with each user of the audio streaming devices 100) gathered utilizing the audio streaming device 610, 612. The results of the aggregate analytics are shared with third parties, such as broadcast stations 618, marketing agencies 620, etc. Some of the aggregate analytics performed by the analytics server 604, specifically for marketing agencies 622 to aid in market research, includes: (1) total reach (i.e. number of listeners) of a given broadcast station at a given timeframe (within a geographical reach of the given broadcast station); (2) a demographic reach of each of one or more broadcast stations (within the geographical reach of the broadcast stations); (3) ad campaign related reports that include cost and effective reach of the ad campaign (within the geographical reach of the broadcast stations the ad campaign was implemented through), etc.

Figure 7A:
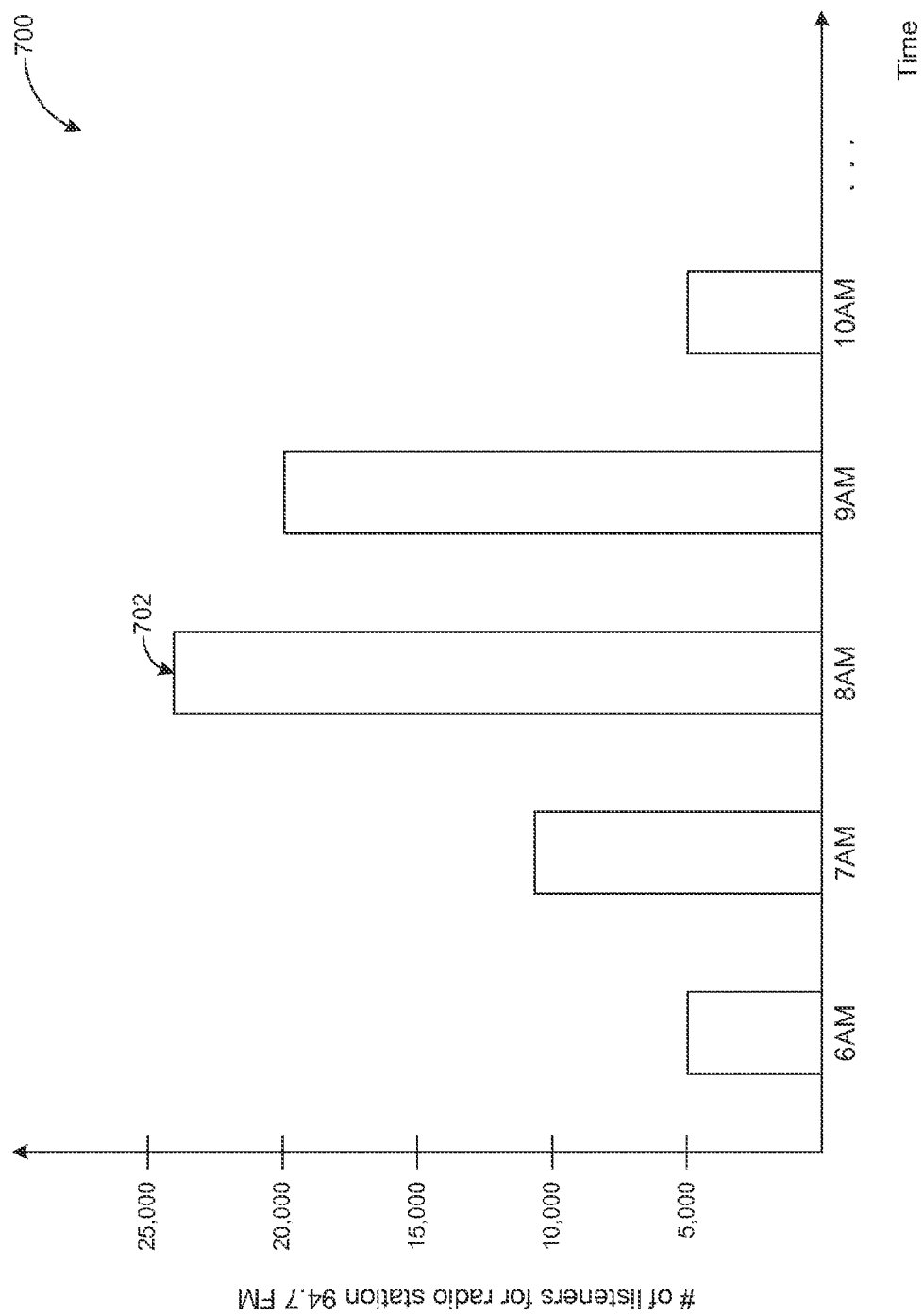
FIG. 7A provides an illustrative example of a total reach report of a given broadcast station at a given timeframe (within a geographical reach of the given broadcast station)

FIG. 7A provides an illustrative example of a total reach report 700 (i.e. number of listeners) of a given broadcast station at a given timeframe (within a geographical reach of the given broadcast station). In embodiments, the cloud platform 602 aggregates the listening record (captured in the data logs) of the various users at a given timeframe (i.e. time measured relative to the date and time of the broadcast of a given audio broadcast) to determine the total number of listeners to the given broadcast station at the given timeframe. In embodiments, the data logs received from the APM 124 includes the date, the time, the audio programming listened to at the date and time, the broadcast station the audio programming was broadcast in, the date and time of broadcast of the audio programming, any metadata associated with the broadcast station and the audio programming (e.g., the broadcast station name, the audio content from the transcribed text of the content, etc.).

In embodiments, the cloud platform 602 utilizes the metadata associated with the broadcast station, such as the broadcast station name, to specifically identify a particular broadcast station and the listeners of that particular broadcast station from other broadcast stations that may broadcast in the same channel, e.g., same FM frequency, but within different geographical areas. For example, when the cloud platform 602 identifies data logs with a broadcast station identified by its FM transmission frequency, e.g., 99.5 MHz, data associated with multiple broadcast stations that use 99.5 MHz within different geographical areas might all be improperly included under one subset. Such a scenario is very likely as a user, listening to the audio streaming device 610, 612, in their vehicle, travel across various geographical areas in any given time period.

So, by using each station's respective station name, e.g., 99.5 FM Now, stored as metadata, the cloud platform 602 can distinguish the different stations when aggregating the data from various data logs of the users. Similarly, other metadata, such as the audio content associated with a popular audio programming, broadcast only on a particular broadcast station, can help distinguish one broadcast station from another when aggregating user data based on data logs from the APMs 124 of various audio streaming devices 610, 612. For example, BBC News is carried primarily by National Public Radio ("NPR") broadcast station in most regions, allowing content associated with BBC News to be attributed to the NPR broadcast station.

In embodiments, given that the audio streaming device 610, 612 allows users to record and play-back an audio programming of the given broadcast station at a later time, the cloud platform 602 measures the total reach of the given broadcast station at a given timeframe based on the users who listened to the audio programming broadcast at the given timeframe irrespective of when the users actually listened to the audio programming. For example, when measuring the total audience who listened to BBC News broadcast on NPR on Apr. 15, 2010, the cloud platform 602 counts all the audio listeners/users who listened to the BBC News broadcast on Apr. 15, 2010, at the time of the broadcast or at a later time, using the audio streaming device 610, 612.

The total reach report 700, generated as discussed above, can help a marketing agency 622 determine the effective reach of a given broadcast station, including the most popular time-slot/audio programming (e.g., determined based on the maximum number of listeners) on the given broadcast station. In FIG. 7A, the total number of listeners listening to the audio programming, broadcast on radio station 94.7 FM, over the course of a particular day is provided. The peak number of listeners, reached by 94.7 FM on the particular day within the 6 am and 10 am time slot was for audio program broadcast at 8 am, where the average listeners for a given audio program is reported (with the assumption that a new audio program is broadcast every hour).

Using well-known techniques, other similar total reach reports, based on the number of listeners reached by a given audio programming, can be generated for different granularity of time basis. Further, the report 700 can also allow marketing agencies 622 to compare the reach of various broadcast stations within a given geographical area at any given time and determine the best broadcast station to advertise. In embodiments, the determination of the best broadcast station can be based on factors such as reach, the demography of the targeted audience, cost to advertise in a given broadcast station, etc.

Figure 7B:
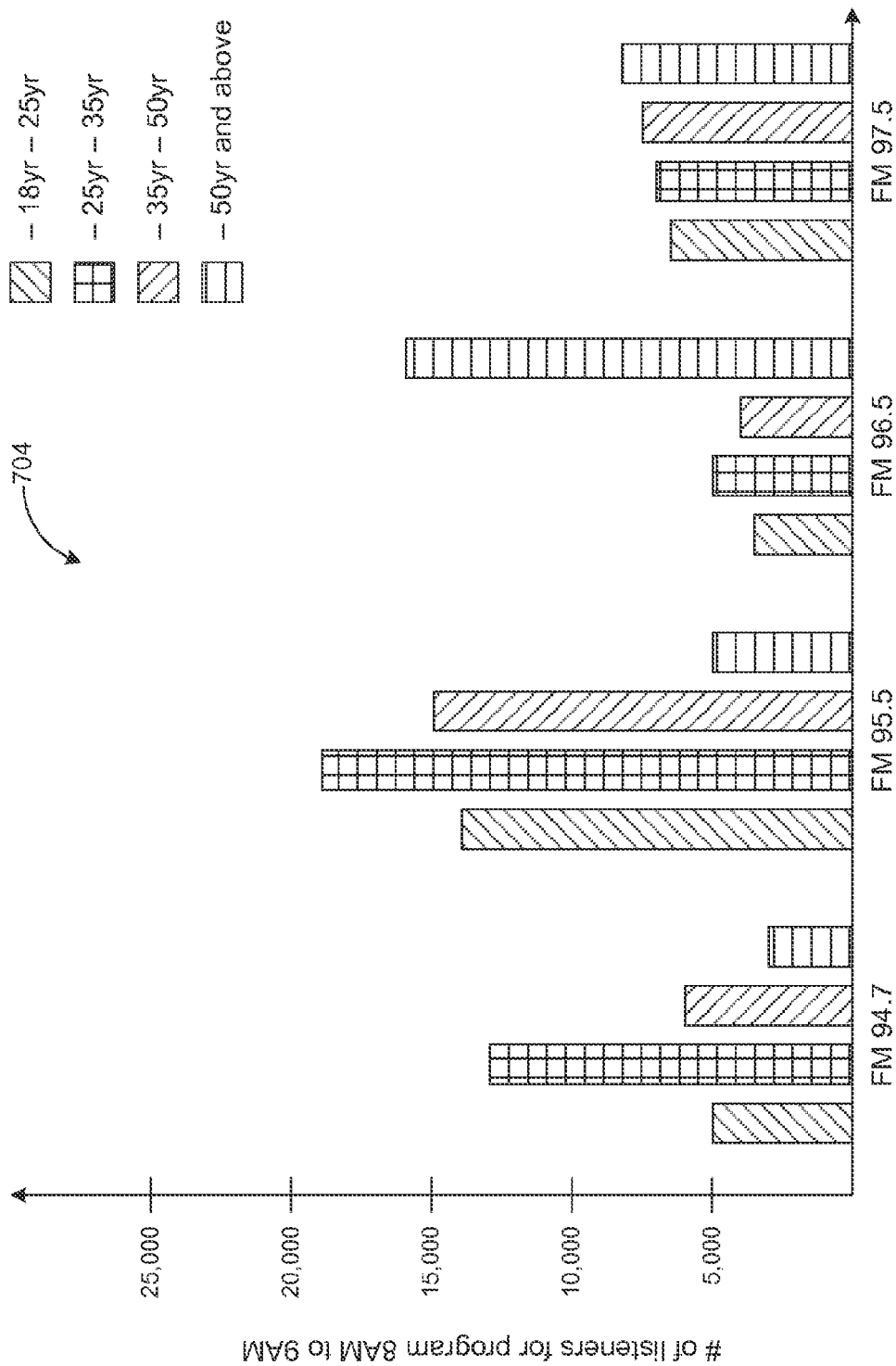
FIG. 7B provides an illustrative example of such a demographic reach report that breaks down the reach of various broadcast stations within a geographical area by age of the listeners of the broadcast stations.

Some of the other aggregate analytics performed by the analytics server 604 of the cloud platform 602, specifically for marketing agencies 622, includes a demographic reach report of each of one or more broadcast stations (within the geographical reach of the broadcast stations). FIG. 7B provides an illustrative example of such a demographic reach report 704 that breaks down the reach of various broadcast stations within a geographical area by age of the listeners of the broadcast stations.

In FIG. 7B, the audience is broadly broken down into four categories based on their age, ranging from a group consisting of listeners of age 18 yr to 25 yrs, a group consisting of listeners of age 25 yr to 35 yrs, a group consisting of listeners of age 35 yr to 50 yrs, and a group consisting of listeners of age 50 yr and above. It should be understood that the age group breakdown here is simply provided for illustration purposes and no way limits the scope of the demographic reach report 704 that can be generated by the cloud platform 602. Other well-known demographic parameters, such as gender, race, ethnicity, social standings, professions, etc., can be used to characterize and group the listeners for generating the demographic reach report 704.

In FIG. 7B, the demographic reach report 704 provides the summary of the total listeners of various audio programs, broadcast from 8 am to 9 am on a particular day, over respective broadcast stations FM 94.7, FM 95.5, FM 96.5 and FM 97.5. Further, the demographic reach report 704 breaks down the total listeners of each audio program broadcast over a particular broadcast station by their age into one of the four groups described above. As discussed earlier, in embodiments, the cloud platform 602 includes all listeners, irrespective of the time the listeners listened to the program, who listened to a particular audio program broadcast at a given timeframe when aggregating the total listeners of the particular audio program broadcast at the given timeframe.

Further, in embodiments, the cloud platform 602 limits the broadcast stations included in the demographic reach report 704 to only those broadcast stations that fall within a particular geographical area, making the total potential audience reachable by each of the compared stations on the demographic reach report 704 the same. So, by comparing the actual total reach of each broadcast stations against the same potential audience, the broadcast station with the best reach can be easily determined. In embodiments, the cloud platform 602 can utilize an external database containing the geographical reach information of the various broadcast stations to determine the comparable broadcast stations when generating the demographic reach report 704. In embodiments, the cloud platform 602 can identify the demography of the listeners based on the identification information of the users, stored in their respective user profiles, which includes the demographic information of the users.

The demographic reach report 704 allows marketing agencies to identify broadcast stations that best reach their desired target audience group. Such targeting allows not only the marketing agencies to target their ad spending in broadcast stations that provide the best reach for the desired target audience group but also allows the broadcast stations to charge a premium for advertising to sought after audience groups, such as the 50 yr and above group of listeners who are generally wealthier than the rest of the population.

Some of the other aggregate analytics performed by the analytics server 604 of the cloud platform 602, specifically for marketing agencies 622, includes an ad campaign effectiveness report 706 that provides the cost and effective reach of the ad campaign (within the geographical reach of the broadcast stations the ad campaign was implemented through). FIG. 7C provides an illustrative example of an ad campaign effectiveness report 706 that can be used by marketing agencies to determine the cost and effective reach achieved by their ad campaign, carried out over multiple broadcast stations FM 95.5, FM 98.5, and FM 99.5. In embodiments, the cloud platform 602 receives information on ads (e.g., metadata identifying contents of the ads) that were part of the ad campaign and generates an ad campaign effectiveness report 706 for the ads of the ad campaign across any broadcast station the campaign was carried out through.

In embodiments, the cloud platform 602 receives the geographical area within which to restrict the ad campaign effectiveness report 706 to and limits the report 706 to only those broadcast stations that broadcast within that geographical area. In embodiments, the cloud platform 602 analyzes the data logs to identify if any of the metadata associated with the ads of the ad campaign closely match the metadata associated with the various ads listened to by the users of the audio streaming device 610, 612. When a match is found between a particular ad from the ad campaign and the ad listened to by the user on a given broadcast channel, then the count of number of listens for the particular ad from the ad campaign is increased by one.

In embodiments, the cloud platform 602 further breaks down the reach of ads of the ad campaign by demographic information and the broadcast station the ads reached the listeners through. In embodiments, the cloud platform 602 receives the cost of advertising the various ads of the ad campaign across various broadcast stations, where the cost of the ads vary from not only one broadcast station to the other but also for ads broadcast within a broadcast station (and changes with the audio programming the ads were broadcast in).

In embodiments, the ad campaign effectiveness report 706 further includes the cost per reach as the amount spent for advertising a given ad (and all instances of the given ad) in a given broadcast channel and the total number of listeners reached by the given ad (from all the runs). In embodiments, the ad campaign effectiveness report 706 further includes the cost per age-group reach as the amount spent for advertising a given ad (and all instances of the given ad) in a given broadcast channel and the total number of listeners of a given age group reached by the given ad (from all the runs).

As discussed above, in embodiments, the cloud platform 602 includes the ads of the ad campaign that were broadcast across multiple broadcast stations. The cloud platform 602, based on the metadata associated with the ad and the metadata associated with the broadcast station that carried the ad (as part of an audio programming), relates a given instance of reach of the ad with the broadcast station through which the reach was achieved. The requesting parties, such as the marketing agencies 622, can utilize the ad campaign effectiveness report 706 to not only compare the effective reach (i.e. the total number of listeners/user reached) of the ad campaign, but also the broadcast station that provides the overall best return as measured by the cost per reach or the cost per age-group reach.

One should note that the ad campaign effectiveness report 706 can be further customized by the requesting party (e.g., marketing agencies 622) through interaction with the cloud platform 602. Some of the customization can include the period within which to limit the data gathered in the report, the geographical area the report covers, other well-known ad effectiveness metrics based on factors such as overall reach, cost, demography, etc.

Figure 7D:
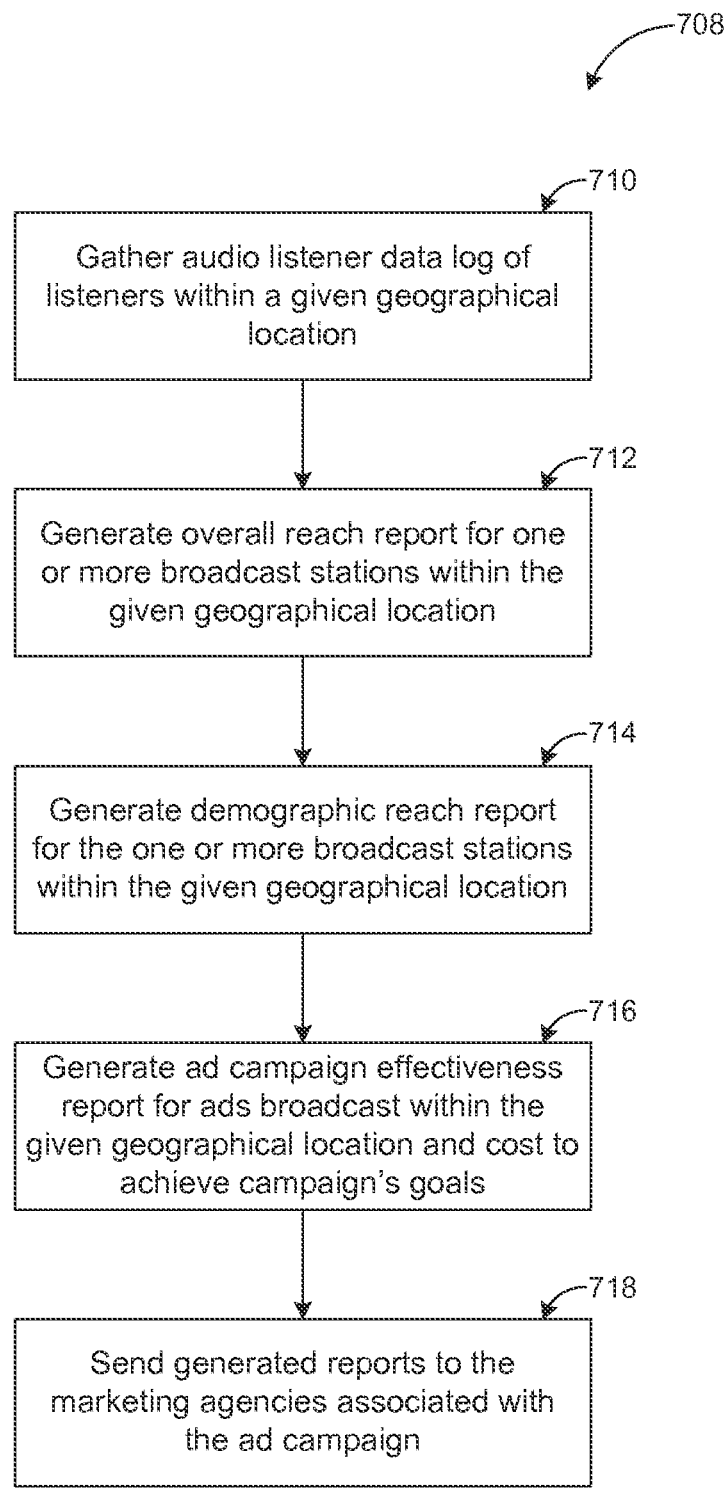
FIG. 7D provides a flow chart of a method implemented by the cloud platform to perform and generate data analytics reports when a request for such reports is received from a marketing agency.

FIG. 7D provides a flow chart of a method 708 implemented by the cloud platform 602 to perform and generate data analytics reports when a request for such reports is received from a marketing agency 622. In step 710 of the method 700, the cloud platform 602 gathers audio listener data log of listeners within a given geographical location. In embodiments, the geographical location is provided by the marketing agency 622 requesting the reports. In step 712, the cloud platform 602 generates overall reach report 702 for one or more broadcast stations within the given geographical location. As discussed above, the one or more broadcast stations within the given geographical location can be determined based on the reach of the broadcast station (e.g., a given FM broadcast stations are limited to broadcasting within designated geographical areas). In step 714, the cloud platform 602 generates demographic reach report 704 for the one or more broadcast stations within the given geographical location. In step 716, the cloud platform 602 generates ad campaign effectiveness report 706 for any ads broadcast within the given geographical location and marketed by the marketing agency 622. In step 718, the cloud platform 602 shares the generated reports with the marketing agency 622.

Some of the aggregate analytics performed by the analytics server 604, specifically for broadcast stations 618 to aid in understanding users' interest, includes an effective reach (i.e. number of listeners) report of a given program broadcast by a given broadcast station (within a geographical reach of the given broadcast station). In embodiments, the cloud platform 602 generates a summary of number of listeners who listened to an audio program broadcast on a given broadcast channel at any given point during the entire period of broadcast of the audio program. As discussed above, the cloud platform 602 determines the users/listeners who listened to an audio program based on the data log irrespective of the time the listeners actually listened to the program.

In embodiments, the data logs further captures timestamps of when a given user re-winded or fast-forwarded any portions of the audio program the given user is listening to. In embodiments, the cloud platform 602 utilizes the user action log from the data logs to determine if the given user took a particular action, e.g., fast-forwarded a portion of the audio program, when determining the number of listeners who listened to the audio program at any given time (measured relative to the timeline of the audio program). For example, if the cloud platform 602 determines 6000 listeners were still listening to the audio program after 12 minutes into the audio program and 500 of the 6000 listeners fast-forwarded the audio program to different time lines of the audio program after 12:01 minutes, then the cloud platform 602 reduces the total listeners to 5500 before accounting for any new listeners who started listening to the program after 12:01 minutes.

In embodiments, the cloud platform 602 marks the report with the transcribed text of the content of the audio program when specific events are identified. Such specific events can be specified by the requesting party when requesting the report from the cloud platform 602. Some specific events can be set as defaults that the cloud platform 602 will automatically identify in the report. Some of the specific events can include broadcast of an ad within the audio program, a drop in listeners (either measured, in total numbers or percentage, relative to the say the average listeners over a given time period), an increase in listeners (measured similar to the drop in listeners), the start of the audio program, the end of the audio program, etc.

Figure 8A:
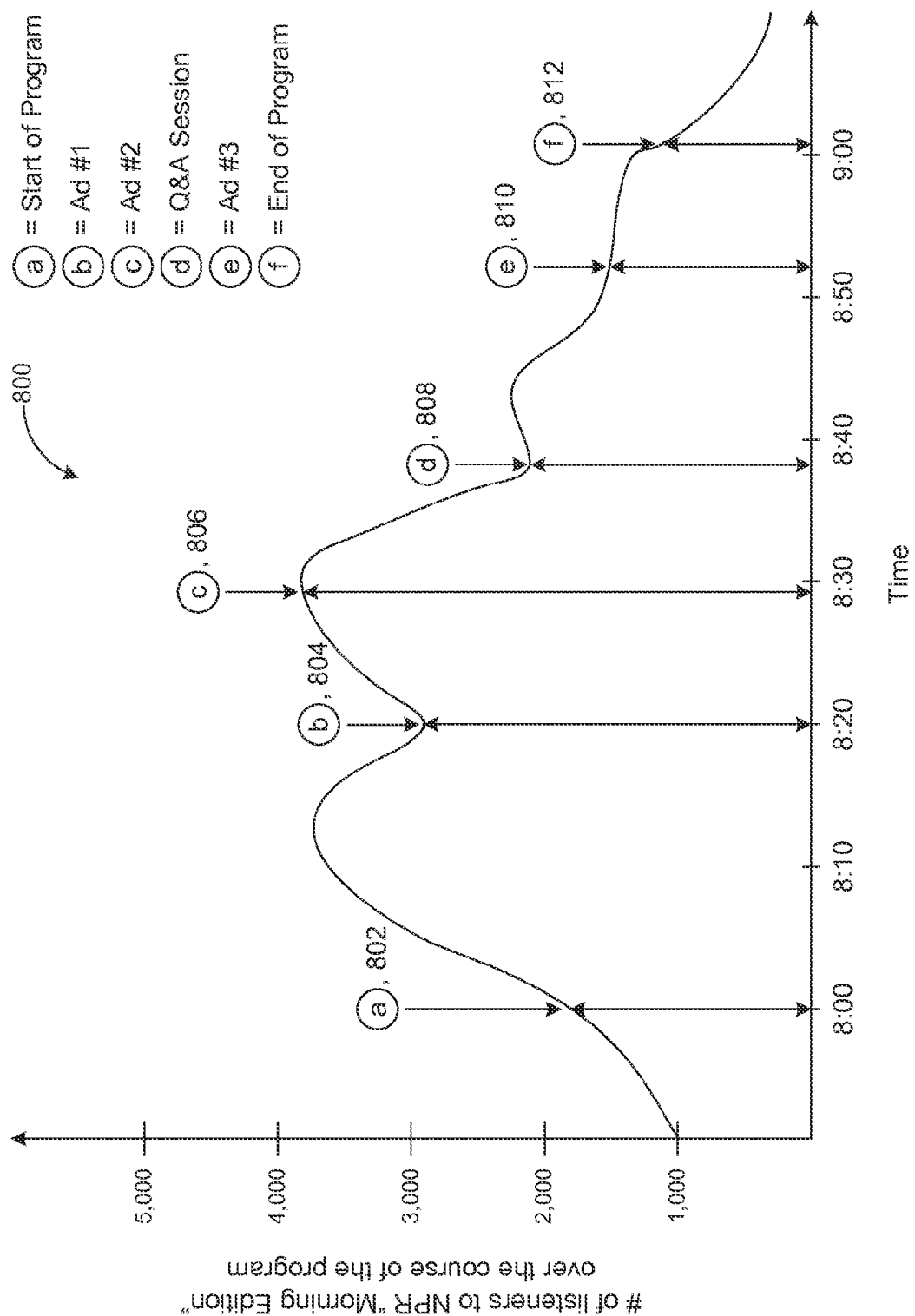
FIG. 8A provides an example of an effective reach report of a program broadcast by a broadcast station.

FIG. 8A provides an example of an effective reach report 800 of the "Morning Edition" program broadcast by NPR in San Francisco on Apr. 15, 2010 from 8 am to 9 am. In the effective reach report 800, portions of the report are marked with the transcribed text of the audio content broadcast at any given time any of the default or configured specific events were triggered. Some of the specific events included in the report 800 include the start of the program 802, the time point 804 the first ad was broadcast, the time point 806 the second ad was broadcast, the time point 804, 808 that coincided with a drop in listeners over a predefined threshold, the time point 806 that coincided with an increase in listeners over a predefined threshold, the portion of the audio program at the time point 808 with the steepest listener loss (here, the Q&A session), the time point 810 the third ad was broadcast, the end of the program 812, etc.

Based on the effective reach report 800, the broadcast station, such as NPR, can not only identify the effective reach of various ads broadcast within the program, but also the portions of the audio program that are most and least interesting to the listeners. Additional inferences from the report 800 are possible for other listener interest based analysis. The provided inferences are provided here for illustrative purposes and are not be considered to limit the inferences that can be drawn from the report 800 to only those discussed above.

Some of the aggregate analytics performed by the analytics server 604, specifically for broadcast stations 618 to aid in understanding users' interest, includes a user action logs, generated using the data logs, which capture the listening habits of one or more users of a given broadcast station. In embodiments, the cloud platform 602 provides a specific user's action log, without all the identification information of the user, to broadcast stations 618 and other interested parties to enable such parties to understand the listening preferences of the specific user and enable the broadcast stations 618 to fine tune their audio programming to appeal to better appeal to users.

In embodiments, the cloud platform 602 restricts the access to action logs of users to a particular broadcast station 618 to only those users who have shown an interest with the particular broadcast station 618, allowing the particular broadcast station 618 to learn other broadcast station preferences of the users listening to the particular broadcast station. Such an understanding can allow the particular broadcast station to further fine-tune its programming to ensure the users listen longer to their programming than they do their competitors' programming.

Further, as discussed above, in embodiments, the cloud platform 602 includes transcribed text at time line points of the audio programming when specific events are triggered, such as broadcast of an ad, etc. Such text can allow the broadcast station to know whether a user's switch to another station was prompted by an ad or was due to other reasons, such as lack of interest in content broadcast at that given point of the audio programming.

Figure 8B:
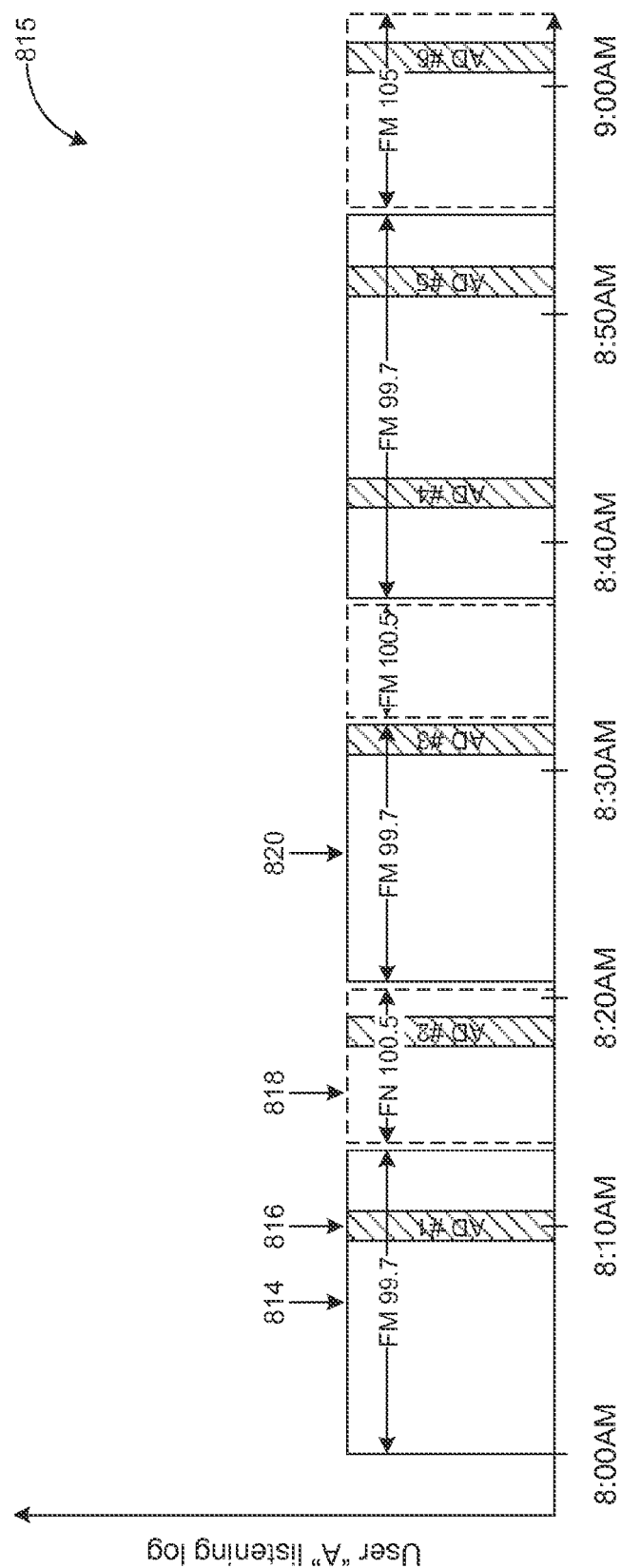
FIG. 8B provides an example of a user action log of user "A" between 8 am and 9 am on a particular day.

FIG. 8B provides an example of a user action log 815 of user "A" between 8 am and 9 am on a particular day. The user "A" started by listening to broadcast station FM 99.7 814 and through the ad #1 816 (implying possible continued interest in the audio program on FM 99.7) but switched to FM 100.5 818 after the resumption of the audio program on FM 99.7 after the ad #1 816 (showing possible loss of interest in the content broadcast at time 8:12 am). The user "A" again switched back 820 to FM 99.7 till the ad #3 prompted the user "A" to switch back to FM 100.5. During the rest of the time slot, the user "A" also listened partly to FM 105. By collating the action logs of users who listened to FM 99.7, the broadcast station 99.7, for example, can glean who its competitors are (i.e. stations that appeal to the same demography of listeners FM 99.7 also appeals to), what prompted the users to switch (for example when a certain number of listeners change channels), what ads appealed to the listeners, what promotions helped the listeners to continue listening to the broadcast station through the ads, etc.

Some of the aggregate analytics performed by the analytics server 604, specifically for broadcast stations 618 to aid in understanding users' interest, includes top songs/programs recorded 822, top songs/programs replayed 824, top stations on users' favorite list 826, top search terms 828 by users of the audio streaming device 100, 610, 612, etc. As discussed above, the various reports 822, 824, 826, 828 can be generated based on the information stored in data logs of the users, such as the name of the audio program listened to (as gathered from the metadata), the time stamp of when the program was listened to, the terms searched for within the audio programs, the terms used to identify and record audio programs, etc.

In embodiments, the cloud platform utilizes custom settings to generate each of the report, where the custom settings can be set by the requesting party or be left with the default settings. In embodiments, the reports can be based on user data collected within a given timeframe (e.g., data gathered within last 7 days). In embodiments, the reports can be limited to users within a geographical location, where the geographical location can be defined based on the user's physical location. In one instance, a user's physical location can be determined by the geographical area of the radio stations the user listens.

FIG. 8C provides an illustrative example of a table of top songs and programs 822 recorded within a given time period by the users using the audio streaming device 610, 612 and the total number of unique recordings of each of the songs/programs recorded. As discussed above, in certain instances, the audio steaming device 610, 612 re-records audio programming when the quality of the prior recording is poorer than that of the current recording. So, by counting only unique recordings (determined by searching data log for any previous recording of audio programming with name of a given song/program), the cloud platform 602 discounts the duplicate recordings and provides the unique recording for any given song/program.

FIG. 8D provides an illustrative example of a table of top songs replayed 824 within a given time period by the users using the audio streaming device 610, 612, the total replays of the top songs and the total number of unique replays of each of the top songs. As discussed above, the cloud platform 602 can generate the result based on the recorded contents of the data logs of the various users using the audio streaming device 610, 612.

FIG. 8E provides an illustrative example of a table of top broadcast stations on the favorite list 826 of the users using the audio streaming device 610, 612 and the total number of listeners for each broadcast station. As discussed earlier, each audio streaming device 610, 612 maintains a list of favorite broadcast stations of a given user. In embodiments, the audio streaming device 610, 612 stores the list as part of the data log associated with the given user. In embodiments, the audio streaming device 610, 612 provides the list to the cloud platform 602 when requested. In embodiments, the cloud platform 602 aggregates the favorite broadcast stations of users to determine the top broadcast stations and its listeners.

FIG. 8F provides an illustrative example of a table of top search terms 828 by users of the audio streaming device 610, 612 and the number of searches garnered by each term. In embodiments, the audio streaming device 610, 612 stores both the search term used to search and record audio programming/songs and search terms searched within a given audio programming (using audio-indexing technique described earlier). In FIG. 8F, the term "CONCERT GAGA WIN", related to a promo run by a broadcast station to give fans ticket for a Lady Gaga concert, had the highest search for content relating to the rules of the content by the listeners. Further, the table includes the count of those searches by listeners used to record audio programs that carried the promotion by the broadcast station (allowing the listeners to later search and listen to the contest rules). Such a search term summary allows broadcast stations 618 and marketers 620 to determine the effectiveness of various ad campaigns. Other well-known analytics can be further performed on the search term summary report 828 to further understand user interests and preferences across demography.

Figure 8G:
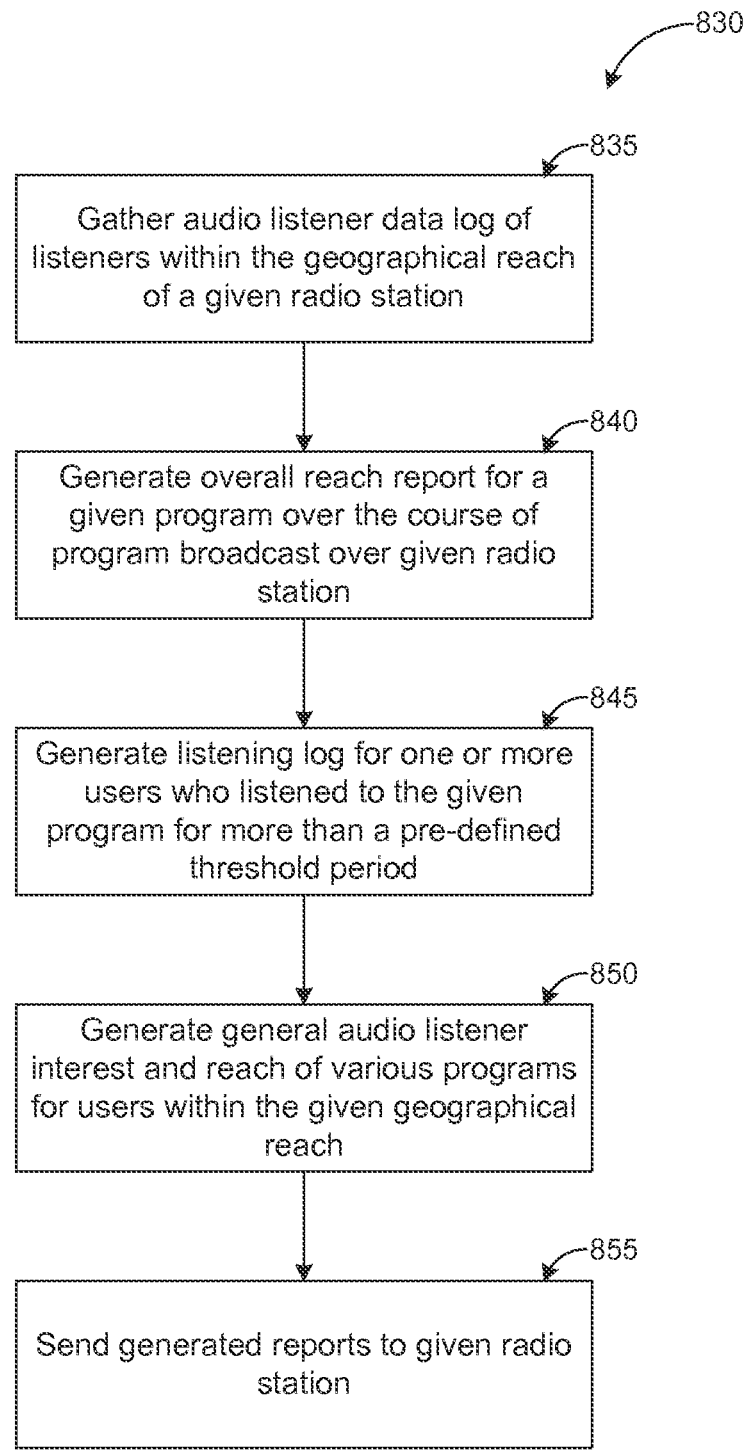
FIG. 8G provides a flow chart of a method implemented by the cloud platform to perform and generate data analytics reports when a request for such reports is received from a broadcast station.

FIG. 8G provides a flow chart of a method 830 implemented by the cloud platform 602 to perform and generate data analytics reports when a request for such reports is received from a broadcast station 618. In step 835, the cloud platform 602 gathers audio listener data log of listeners within the geographical reach of a given radio station. In step 840, the cloud platform 602 generates overall reach report for a given program over the course of program broadcast over given radio station. In step 845, the cloud platform 602 generates user action log/listening log for one or more users who listened to the given program for more than a pre-defined threshold period. In step 850, the cloud platform 602 generates general audio listener interest and reach of various programs for users within the given geographical reach. In step 855, the cloud platform 602 shares the generated reports with the given radio station that requested the reports.

As discussed earlier, in some embodiments, the cloud platform 602 provides access to the results of the various user listening related analytics and the user vehicle related analytics to the associated user. In some embodiments, the information provided by the cloud platform 602 to the user/listener includes a customized radio station for the user based on the determined listening preferences of the user, a driving analysis of the user, a vehicle diagnostics information, any vehicle tracking related information (such as current location of vehicle), etc. As discussed earlier, in some embodiments, the cloud platform 602 allows a user to access the information using a computing device 622. In one instance, the user's computing device 622 is a smart phone and the smart phone is used to access the information through the network 608.

Figure 9A:
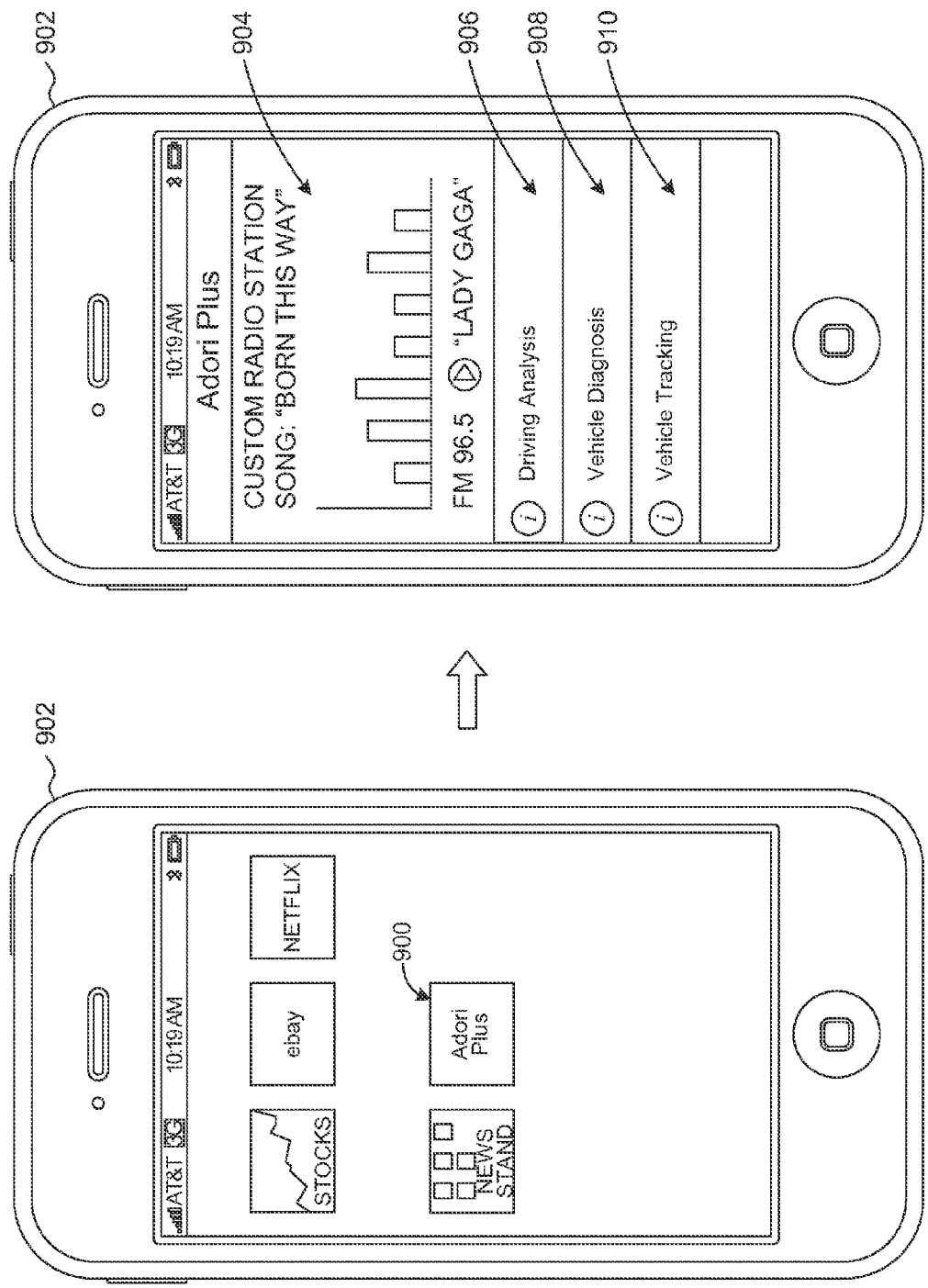
FIG. 9A provides an illustration of how a smart phone can be utilized to retrieve and view the various information provided by the cloud platform to the user.

FIG. 9A provides an illustration of how a smart phone can be utilized to retrieve and view the various information provided by the cloud platform 602 to the user. As discussed earlier, the cloud platform 602 can have an associated App 900, which when installed on the user's smart phone 630, allows the user to access the results related to the user on the cloud platform 602 through the App 900. In some embodiments, the cloud platform 602 can identify the information associated with the user by matching a stored user profile with any identifying information available on the smart phone 630 which can be provided by the App 900 to the cloud platform 602. In another embodiment, the cloud platform 602 can require the user to register with the cloud platform 602 using the App 900 and provide identifying information which can be used by cloud platform 602 to identify an associated user profile for the user.

In some embodiments, once a user profile is associated with an App 900, the cloud platform 602 allows the user to access the information available on the cloud platform 602 by clicking on an icon of the App 900 on the smart phone 630 (without having to repeatedly provide any identifying information). The App 900 can display the information retrieved from the cloud platform 602 according to their respective categories 904-910. The App 900 provides a customized radio station 904 for the user based on the analyzed listening preferences of the user. As discussed earlier, the cloud platform 902 can provide the listening preferences of the user based on the data gathered about the user from the data logs. The gathered data used by the cloud platform 902 to determine listening preferences of the user include the songs/programs recorded by the user, the songs replayed by the user, the stations listened to by the user, the stations on the user's favorite list, the songs/programs searched and recorded by the user, etc.

In embodiments, the App 900 utilizes the receives listening preferences from the cloud platform 902 to provide a customized radio station for the user. In embodiments, the received listening preferences is provided as genres the user might be interested in, the title of songs/programs the user might be interested in, the name of the broadcast stations the user might be interested in, etc. In embodiments, the App 900 utilizes the listening preferences of the user the smartphone 902 to search user's music library for any songs/programs that matches the user's preferences. In embodiments, the App 900 utilizes the listening preferences of the user to search audio sources, such as other music apps (e.g., Pandora), to identify songs/programs that match the genre or the radio station that the user might be interested in. In embodiments, the App 900 combines the various audio sources into a single audio source by automatically deciding which song/program to play from which source at what time and creates a custom radio station for the user.

Figure 9B:
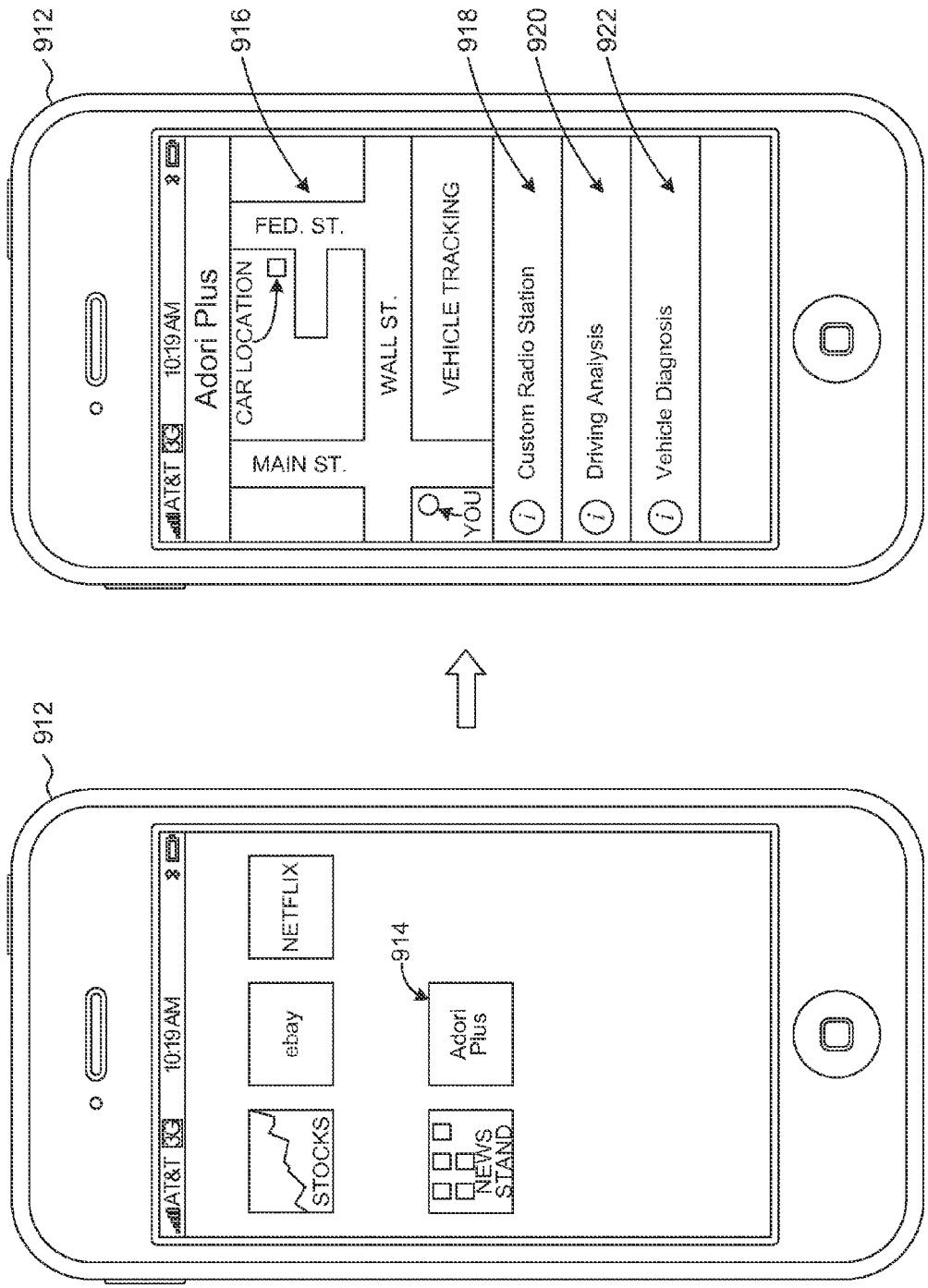
FIG. 9B provides an illustration of how a smart phone can be utilized to retrieve and view the vehicle tracking information provided by the cloud platform to the user.

The App 900 further provides a section with the results of the driving analysis 906, a section with vehicle diagnostics information 908, and a section with vehicle tracking information 910. In one embodiment, each section 904-910 of the App 900, when clicked, provides a detailed breakdown of the various information associated with the clicked section 904-910 (e.g., FIG. 9B), similar to the displayed custom radio station 904. In FIG. 9B, the vehicle tracking associated information 916 is displayed in the App 900 while the custom radio station is provided as section 918 that can be clicked to retrieve the associated detailed information 904.

FIG. 9B provides an illustration of how a smart phone can be utilized to retrieve and view the vehicle tracking information provided by the cloud platform 602 to the user. As discussed earlier, the cloud platform 602 can constantly track the current location of the user's vehicle when an audio streaming device 100 (e.g., a standalone audio streaming device 100 shown in FIG. 4C) is powered, in communication with the cloud platform 602 and within the vehicle being tracked. In embodiments, the GPS module integrated with the audio streaming device 100 provides the cloud platform 602 with the current location of the user's vehicle. In embodiments, the App 914 interacts with the cloud platform 602 to determine the current location of the user's vehicle when the user utilizes the vehicle tracking function 910 of the App 914.

In embodiments, the App 914 provides the current location of the vehicle on a map 916 of the area where the vehicle is parked, allowing the user to track the vehicle. The position of the user, determined using the GPS module of the smartphone 912, is provided within the map to help the user navigate to the vehicle when needed. In embodiments, the App 914 provides an alert to the user through the App 912 when the vehicle is moved (e.g., vehicle is towed) and the user's current location is not within the proximity of the vehicle. As discussed earlier, the audio streaming device 100 can track a vehicle's motion utilizing the multi-axis accelerometer.

In embodiments, the audio streaming device 100 sends an automatic location update when the vehicle's GPS coordinates changes. In embodiments, the cloud platform 602 can in turn send an automatic update to the App 912 of such a change in coordinates. In embodiments, the App 912 can determine whether to provide a warning to the user based on the proximity of the user to the vehicle when a location update is received from the cloud platform 602.

Figure 10:
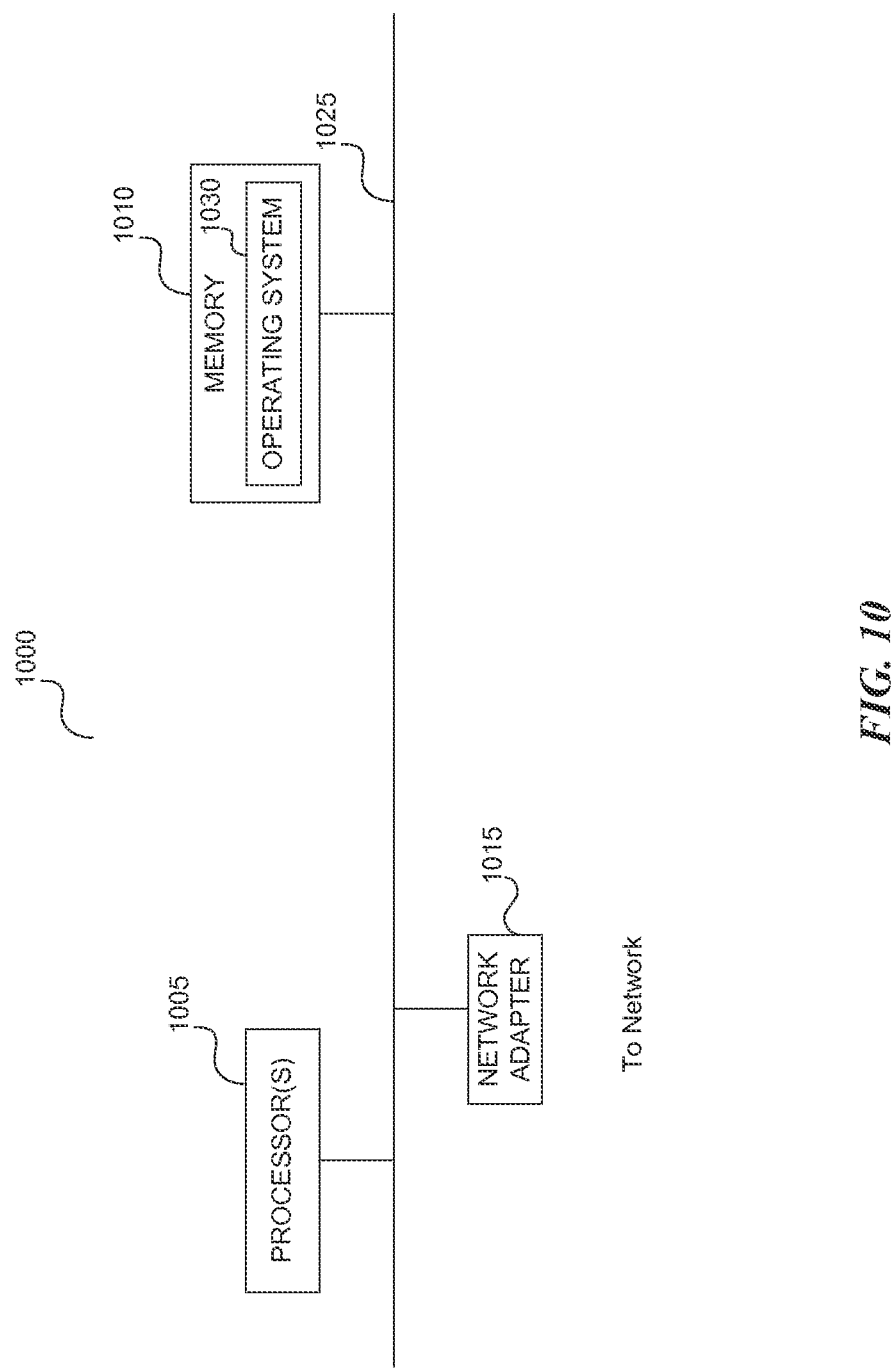
FIG. 10 is a block diagram of a processing system that can implement operations of the present invention.

FIG. 10 is a block diagram of an apparatus that may perform various operations, and store various information generated and/or used by such operations, according to an embodiment of the disclosed technique. The apparatus can represent any computer or processing system described herein. The processing system 1000 is a hardware device on which any of the entities, components or services depicted in the examples of FIGS. 1-9 (and any other components described in this specification) can be implemented, such as query prediction unit, storage unit, stats depot etc.

The processing system 1000 includes one or more processors 1005 and memory 1010 coupled to an interconnect 1015. The interconnect 1015 is shown in FIG. 10 as an abstraction that represents any one or more separate physical buses, point to point connections, or both connected by appropriate bridges, adapters, or controllers. The interconnect 1015, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The processor(s) 1005 is/are the central processing unit (CPU) of the processing system 1000 and, thus, control the overall operation of the processing system 1000. In certain embodiments, the processor(s) 1005 accomplish this by executing software or firmware stored in memory 1010. The processor(s) 1005 may be, or may include, one or more programmable general-purpose or special-purpose microprocessors, digital signal processors (DSPs), programmable controllers, application specific integrated circuits (ASICs), programmable logic devices (PLDs), trusted platform modules (TPMs), or the like, or a combination of such devices.

The memory 1010 is or includes the main memory of the processing system 1000. The memory 1010 represents any form of random access memory (RAM), read-only memory (ROM), flash memory, or the like, or a combination of such devices. In use, the memory 1010 may contain a code. In one embodiment, the code includes a general programming module configured to recognize the general-purpose program received via the computer bus interface, and prepare the general-purpose program for execution at the processor. In another embodiment, the general programming module may be implemented using hardware circuitry such as ASICs, PLDs, or field-programmable gate arrays (FPGAs).

Also connected to the processor(s) 1005 through the interconnect 1015 are a network adapter 1030, a storage device(s) 1020 and I/O device(s) 1025. The network adapter 1030 provides the processing system 1000 with the ability to communicate with remote devices, over a network and may be, for example, an Ethernet adapter or Fibre Channel adapter. The network adapter 1030 may also provide the processing system 1000 with the ability to communicate with other computers within the cluster. In some embodiments, the processing system 1000 may use more than one network adapter to deal with the communications within and outside of the cluster separately.

The I/O device(s) 1025 can include, for example, a keyboard, a mouse or other pointing device, disk drives, printers, a scanner, and other input and/or output devices, including a display device. The display device can include, for example, a cathode ray tube (CRT), liquid crystal display (LCD), or some other applicable known or convenient display device.

The code stored in memory 1010 can be implemented as software and/or firmware to program the processor(s) 1005 to carry out actions described above. In certain embodiments, such software or firmware may be initially provided to the processing system 1000 by downloading it from a remote system through the processing system 1000 (e.g., via network adapter 1030).

The techniques introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Software or firmware for use in implementing the techniques introduced here may be stored on a machine-readable storage medium and may be executed by one or more general-purpose or special-purpose programmable microprocessors. A "machine-readable storage medium", as the term is used herein, includes any mechanism that can store information in a form accessible by a machine.

A machine can also be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

A machine-accessible storage medium or a storage device(s) 620 includes, for example, recordable/non-recordable media (e.g., ROM; RAM; magnetic disk storage media; optical storage media; flash memory devices; etc.), etc., or any combination thereof. The storage medium typically may be non-transitory or include a non-transitory device. In this context, a non-transitory storage medium may include a device that is tangible, meaning that the device has a concrete physical form, although the device may change its physical state. Thus, for example, non-transitory refers to a device remaining tangible despite this change in state.

The term "logic", as used herein, can include, for example, programmable circuitry programmed with specific software and/or firmware, special-purpose hardwired circuitry, or a combination thereof.

What is claimed is:

1. An audio system comprising:
 a processing module;
 a receiver module for receiving a radio frequency (RF) input signal of a given bandwidth, wherein the received RF input signal is associated with a plurality of radio stations, each radio station being associated with a given frequency within the given bandwidth of the received RF input signal;

an Analog to Digital Converter (ADC) coupled to the receiver, the ADC being configured to digitize the received RF input signal, the ADC being further coupled to the processing module;

at least one memory storing computer-executable instructions, wherein the processing module is configured to access the at least one memory and execute the computer-executable instructions to perform a set of acts, the acts including:

selecting a particular radio station from the plurality of radio stations, the selection being performed by selecting a portion of the digitized RF input signal associated with a particular frequency, wherein the particular frequency is associated with the particular radio station;

shifting the particular frequency associated with the selected portion of the digitized RF input signal to an intermediate frequency (IF);

demodulating the frequency shifted portion of the RF input signal associated with the particular radio station, the demodulation resulting in an output signal; and based on the output signal, generating at least one time division multiplexed signal.

2. The audio system of claim 1, the acts further including:
demodulating the frequency shifted portion of the RF input signal associated with the particular radio station, the demodulation resulting in a metadata associated with the output signal.

3. The audio system of claim 2, the acts further including:
buffering the time division multiplexed signal in a second memory;
based on the buffered time division multiplexed signal, generating the output signal;
transcribing a portion of the output signal into a text; and
storing the output signal, the associated metadata, and the transcribed text in a third memory, wherein the transcribed text and the metadata allows an identification of a content associated with the output signal.

4. The audio system of claim 3, the acts further including:
receiving an output signal retrieve request from a user, the output signal retrieve request including one or more search parameters;
based on the one or more search parameters, identifying the stored output signal from the third memory, the identification based on a match between the metadata associated with the output signal and the one or more search parameters;
retrieving the identified output signal; and
serving the retrieved output signal to the user.

5. The audio system of claim 4, the acts further including:
when a pause request is received, pausing the serving of the output signal to the user;
when a play request is received, resuming the serving of the output signal to the user;
when a rewind request is received, rewinding a playing position of the output signal; and
when a forward request is received, forwarding the playing position of the output signal.

6. The audio system of claim 3, wherein the received user input includes one or more of:
a title of the output signal;
an indicia associated a given broadcast station name;
a genre associated with the output signal; or
an artist associated with the output signal.

7. The audio system of claim 3, wherein the metadata associated with the output signal includes metadata embedded in the RF input signal using a radio data system communication protocol.

8. The audio system of claim 7, wherein the embedded metadata includes one or more of:
a time stamp associated with the output signal;
a broadcast station name;
an RF frequency of broadcast;
a title of the output signal;
a genre associated with the output signal; or
an artist associated with the output signal.

9. The audio system of claim 1, wherein the output signal is an audio program broadcast by a particular broadcast station.

10. A method, comprising:
receiving, by a computing system including a processor, a radio frequency (RF) input signal of a given bandwidth, wherein the received RF input signal is associated with a plurality of radio stations, each radio station being associated with a given frequency within the given bandwidth of the received RF input signal;
digitizing, by the computing system, the received RF input signal;
selecting, by the computing system, a particular radio station from the plurality of radio stations, the selection being performed by selecting a portion of the digitized RF input signal associated with a particular frequency, wherein the particular frequency is associated with the particular radio station;
shifting, by the computing system, the particular frequency associated with the selected portion of the digitized RF input signal to an intermediate frequency (IF);
demodulating, by the computing system, the frequency shifted portion of the RF input signal associated with the particular radio station, the demodulation resulting in an output signal; and
based on the output signal, generating, by the computing system, at least one time division multiplexed signal.

11. The method of claim 10, further including:
demodulating, by the computing system, the frequency shifted portion of the RF input signal associated with the particular radio station, the demodulation resulting in a metadata associated with the output signal.

12. The method of claim 11, further including:
buffering, by the computing system, the time division multiplexed signal in a second memory;
based on the buffered time division multiplexed signal, generating, by the computing system, the output signal;
transcribing, by the computing system, a portion of the output signal into a text;
storing, by the computing system, the output signal, the associated metadata, and the transcribed text in a third memory, wherein the transcribed text and the metadata allows an identification of a content associated with the output signal.

13. The method of claim 12, the acts further including:
receiving, by the computing system, an output signal retrieve request from a user, the output signal retrieve request including one or more search parameters;
based on the one or more search parameters, identifying the stored output signal from the third memory, the identification based on a match between the metadata associated with the output signal and the one or more search parameters;
retrieving, by the computing system, the identified output signal; and serving, by the computing system, the retrieved output signal to the user.

14. The method of claim 13, the acts further including:
when a pause request is received, pausing, by the computing system, the serving of the output signal to the user;
when a play request is received, resuming, by the computing system, the serving of the output signal to the user;
when a rewind request is received, rewinding, by the computing system, a playing position of the output signal; and
when a forward request is received, forwarding, by the computing system, the playing position of the output signal.

15. The method of claim 12, wherein the received user input includes one or more of:
a title of the output signal;
an indicia associated a given broadcast station name;
a genre associated with the output signal; or
an artist associated with the output signal.

16. The method of claim 12, wherein the metadata associated with the output signal includes metadata embedded in the RF input signal using a radio data system communication protocol.

17. The method of claim 16, wherein the embedded metadata includes one or more of:
a time stamp associated with the output signal;
a broadcast station name;
an RF frequency of broadcast;
a title of the output signal;
a genre associated with the output signal; or
an artist associated with the output signal.

18. The method of claim 10, wherein the output signal is an audio program broadcast by a particular broadcast station.

19. An audio system comprising:
a processor;
means for receiving a radio frequency (RF) input signal of a given bandwidth, wherein the received RF input signal is associated with a plurality of radio stations, each radio station being associated with a given frequency within the given bandwidth of the received RF input signal;
means for digitizing the received RF input signal;
means for storing computer-executable instructions, wherein the processor is configured to access and execute the computer-executable instructions to perform a set of acts, the acts including:
selecting a particular radio station from the plurality of radio stations, the selection being performed by selecting a portion of the digitized RF input signal associated with a particular frequency, wherein the particular frequency is associated with the particular radio station;
shifting the particular frequency associated with the selected portion of the digitized RF input signal to an intermediate frequency (IF);
demodulating the frequency shifted portion of the RF input signal associated with the particular radio station, the demodulation resulting in an output signal; and
based on the output signal, generating at least one time division multiplexed signal.

20. The audio system of claim 19, the acts further including:
demodulating the frequency shifted portion of the RF input signal associated with the particular radio station, the demodulation resulting in a metadata associated with the output signal.

21. The audio system of claim 20, the acts further including:
buffering the time division multiplexed signal in a second memory;
based on the buffered time division multiplexed signal, generating the output signal;
transcribing a portion of the output signal into a text; and
storing the output signal, the associated metadata, and the transcribed text in a third memory, wherein the transcribed text and the metadata allows an identification of a content associated with the output signal.

22. The audio system of claim 21, the acts further including:
receiving an output signal retrieve request from a user, the output signal retrieve request including one or more search parameters;
based on the one or more search parameters, identifying the stored output signal from the third memory, the identification based on a match between the metadata associated with the output signal and the one or more search parameters;
retrieving the identified output signal; and
serving the retrieved output signal to the user.

23. The audio system of claim 22, the acts further including:
when a pause request is received, pausing the serving of the output signal to the user;
when a play request is received, resuming the serving of the output signal to the user;
when a rewind request is received, rewinding a playing position of the output signal; and
when a forward request is received, forwarding the playing position of the output signal.

24. The audio system of claim 21, wherein the received user input includes one or more of:
a title of the output signal;
an indicia associated a given broadcast station name;
a genre associated with the output signal; or
an artist associated with the output signal.

25. The audio system of claim 21, wherein the metadata associated with the output signal includes metadata embedded in the RF input signal using a radio data system communication protocol.

26. The audio system of claim 25, wherein the embedded metadata includes one or more of:
a time stamp associated with the output signal;
a broadcast station name;
an RF frequency of broadcast;
a title of the output signal;
a genre associated with the output signal; or
an artist associated with the output signal.

27. The audio system of claim 19, wherein the output signal is an audio program broadcast by a particular broadcast station.

* * * * *